US008917151B2

(12) United States Patent
Dayan et al.

(10) Patent No.: US 8,917,151 B2
(45) Date of Patent: *Dec. 23, 2014

(54) TRANSITION BETWEEN A LAMINATED PCB AND A WAVEGUIDE THROUGH A CAVITY IN THE LAMINATED PCB

(75) Inventors: Elad Dayan, Beit-Dagan (IL); Yigal Leiba, Holon (IL); Baruch Schwarz, Raanana (IL); Amir Shmuel, Nofit (IL)

(73) Assignee: Siklu Communication Ltd., Petach-Tikva (IL)

( * ) Notice: Subject to any disclaimer, the term of this patent is extended or adjusted under 35 U.S.C. 154(b) by 699 days.

This patent is subject to a terminal disclaimer.

(21) Appl. No.: 13/031,277

(22) Filed: Feb. 21, 2011

(65) Prior Publication Data

US 2011/0140979 A1 Jun. 16, 2011

Related U.S. Application Data

(63) Continuation-in-part of application No. 12/554,987, filed on Sep. 8, 2009, and a continuation-in-part of application No. 12/791,936, filed on Jun. 2, 2010, now Pat. No. 8,536,954.

(60) Provisional application No. 61/380,217, filed on Sep. 4, 2010.

(51) Int. Cl.
*H01P 5/107* (2006.01)
*H01P 3/12* (2006.01)
*H01P 11/00* (2006.01)

(52) U.S. Cl.
CPC ............... *H01P 5/107* (2013.01); *H01P 3/121* (2013.01); *H01P 11/002* (2013.01)
USPC .............................................. 333/26; 333/247

(58) Field of Classification Search
CPC ....................................................... H01P 5/107
USPC ................................................ 333/26, 33, 247
See application file for complete search history.

(56) References Cited

U.S. PATENT DOCUMENTS

| | | | |
|---|---|---|---|
| 5,202,648 A | 4/1993 | McCandless | |
| 5,311,406 A * | 5/1994 | Snodgrass et al. | 361/792 |
| 5,929,728 A | 7/1999 | Barnett et al. | |
| 5,982,250 A * | 11/1999 | Hung et al. | 333/26 |
| 6,239,669 B1 * | 5/2001 | Koriyama et al. | 333/26 |
| 6,301,122 B1 | 10/2001 | Ishikawa et al. | |
| 6,870,438 B1 * | 3/2005 | Shino et al. | 333/26 |
| 6,958,662 B1 * | 10/2005 | Salmela et al. | 333/26 |
| 7,911,292 B2 * | 3/2011 | Byun et al. | 333/26 |
| 2003/0076188 A1 * | 4/2003 | Dawn et al. | 333/26 |

* cited by examiner

*Primary Examiner* — Benny Lee

(57) ABSTRACT

A system for injecting and guiding millimeter-waves through a Printed Circuit Board (PCB) including at least two laminas belonging to a PCB, an electrically conductive plating applied on the insulating walls of a cavity formed perpendicularly through the laminas, and optionally a probe located above the cavity printed on a lamina belonging to the PCB. Optionally, the cavity guides millimeter-waves injected by the probe at one side of the cavity to the other side of the cavity.

19 Claims, 23 Drawing Sheets

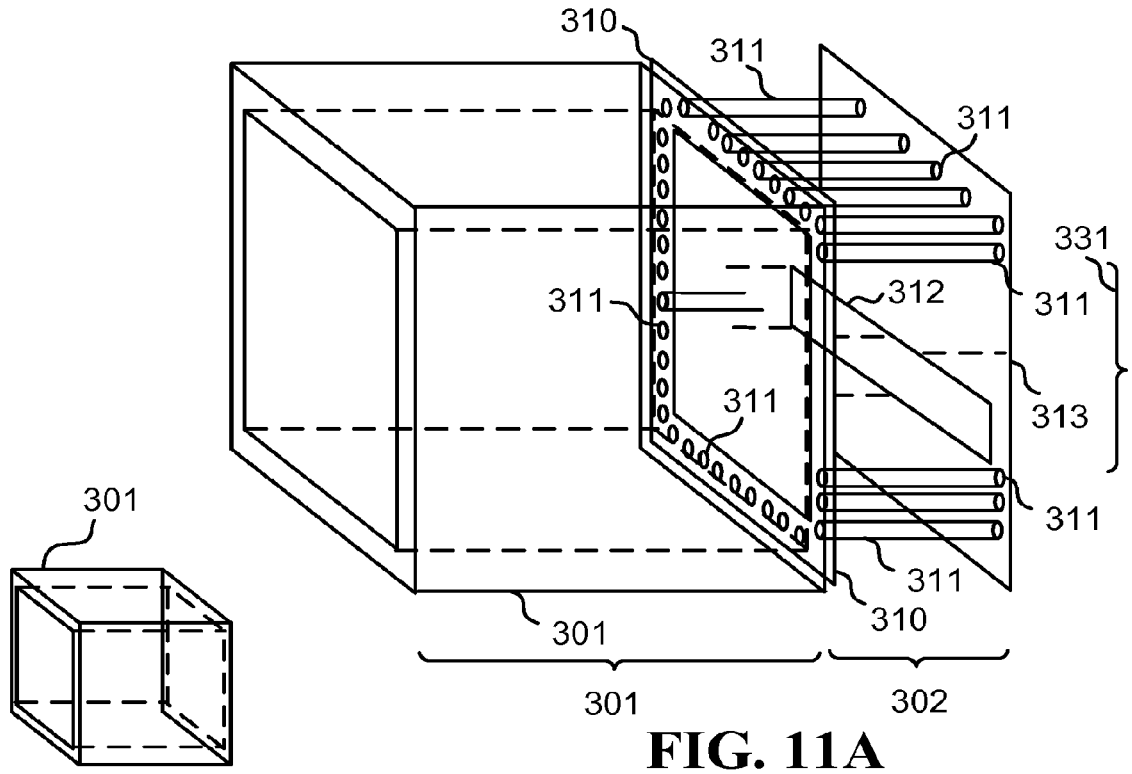
FIG. 11A
FIG. 11B
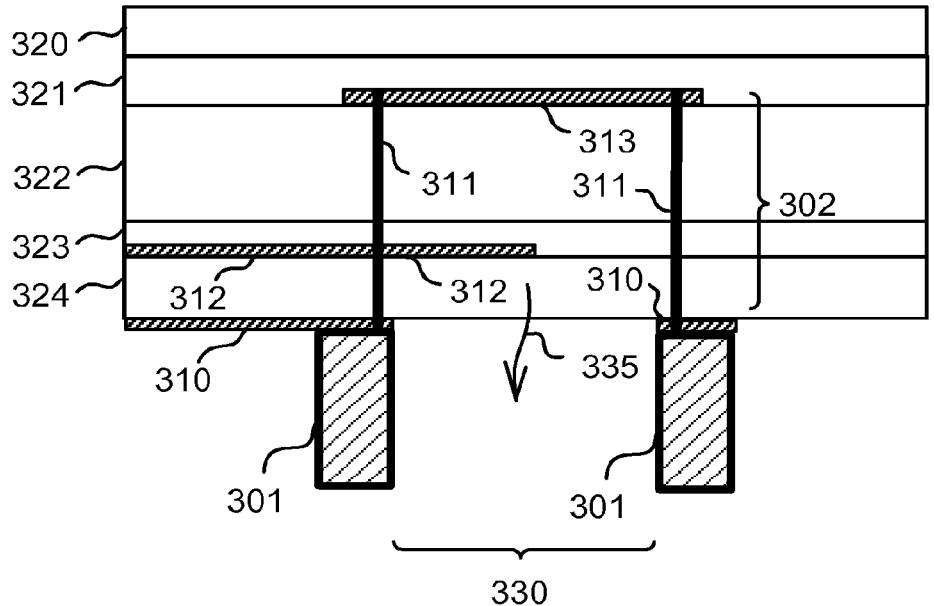
FIG. 11C

TRANSITION BETWEEN A LAMINATED PCB AND A WAVEGUIDE THROUGH A CAVITY IN THE LAMINATED PCB

CROSS-REFERENCE TO RELATED APPLICATIONS

This application is a continuation-in-part of application Ser. No. 12/554,987, filed on Sep. 8, 2009. This application is also a continuation-in-part of application Ser. No. 12/791,936, filed on Jun. 2, 2010, and published as U.S. Pat. No. 8,536,954 on Sep. 17, 2013. This application also claims the benefit of U.S. Provisional Patent Application No. 61/380,217, filed on Sep. 4, 2010, incorporated herein by reference.

TECHNICAL FIELD

Some of the disclosed embodiments relate to millimeter-wave systems, and more specifically to a waveguide comprising laminate structure.

BACKGROUND

Transporting and guiding millimeter-waves and millimeter-wave signals through and between different elements of a distributed system usually requires a set of discrete components such as backshort surfaces, waveguides, transmission lines and antennas. Integration of millimeter-wave components and substrates often results in expensive and complex systems.

SUMMARY OF THE INVENTION

In one embodiment, a system for injecting and guiding millimeter-waves through a Printed Circuit Board (PCB) includes at least two laminas belonging to a PCB. An electrically conductive plating is applied on the insulating walls of a cavity formed perpendicularly through the laminas. Optionally, a probe located above the cavity is printed on a lamina belonging to the PCB. In one embodiment, the cavity guides millimeter-waves injected by the probe at one side of the cavity to the other side of the cavity.

In one embodiment, electrically conductive surfaces are printed on the at least two laminas, the electrically conductive surfaces extend outwards from the cavity, and are electrically connected to the electrically conductive plating. Optionally, at least 10 Vertical Interconnect Access (VIA) holes go through the at least two laminas and the electrically conductive surfaces. Optionally, The VIA holes are plated or filled with electrically conductive material, which is connected to the electrically conductive surfaces, and the VIA holes are located around the cavity, forming an electrically conductive cage.

In one embodiment, a ground layer or at least one ground trace associated with a transmission line signal trace forms a transmission line for millimeter waves, the transmission line reaching the probe. Optionally, the ground trace is electrically connected to at least one of the electrically conductive surfaces, and the transmission line carries a millimeter-wave signal from a source connected to one end of the transmission line to the probe. In one embodiment, VIA holes electrically connect the electrically conductive plating to the ground layer or the at least one ground trace. In one embodiment, the at least two laminas are PCB laminas, laminated together by at least one prepreg lamina. In one embodiment, the at least two laminas are PCB laminas, out of which at least one is a prepreg bonding lamina.

In one embodiment, electrically conductive surfaces are printed on the at least two laminas. The surfaces extend outwards from the cavity and are electrically connected to the electrically conductive plating. Optionally, a ground layer or at least one ground trace associated with a transmission line signal trace forms a transmission line for millimeter-waves, the transmission line reaching the probe. Optionally, the ground trace is electrically connected to at least one of the electrically conductive surfaces, and the transmission line carries a millimeter-wave signal from a source connected to one end of the transmission line to the probe. In one embodiment, a receiver probe is located below the cavity, and printed on a lamina belonging to the laminate structure. Optionally, the receiver probe receives millimeter-waves injected to the cavity by the probe located above the cavity.

In one embodiment, a discrete waveguide is located below the cavity and as a continuation to the cavity. The discrete waveguide passes-through waves guided by the cavity into the discrete waveguide. In one embodiment, the cavity is dimensioned to form a waveguide having a cutoff frequency above 20 GHz. In one embodiment, the same lamina used to carry the probe on one side, is the lamina used to carry the ground trace on the opposite side, and, optionally, the lamina carrying the probe is made out of a soft laminate material suitable to be used as a millimeter-wave band substrate in PCB, such as Rogers® 4350B laminate material, Arlon CLTE-XT laminate material, or Arlon AD255A laminate material.

In one embodiment, a system for injecting and guiding millimeter-waves through a PCB includes a plurality of VIA holes passing through at least two laminas of a laminate structure belonging to a PCB. The VIA holes are placed side by side forming a contour of a waveguide aperture. Optionally, the laminas are at least partially transparent to at least a range of millimeter-wave frequencies. Optionally, the VIA holes are plated or filled with an electrically conductive material, forming an electrically conductive cage enclosing the contour of the waveguide aperture. Optionally, a probe located above the electrically conductive cage is printed on a lamina belonging to the laminate structure. In one embodiment, the electrically conductive cage guides millimeter-waves, transmitted by the probe, through the at least two laminas.

In one embodiment, a cavity is confined by the electrically conductive cage, the cavity going through the at least two laminas, and the millimeter-waves are guided through the cavity. In one embodiment, electrically conductive surfaces are printed on the at least two laminas, such that the VIA holes pass through the electrically conductive surfaces, and the electrically conductive surfaces enclose the contour.

In one embodiment, a system for injecting and guiding millimeter-waves through a PCB includes at least one lamina belonging to a PCB, the at least one lamina includes a cavity shaped in the form of a waveguide aperture. Optionally, an electrically conductive plating is applied on the insulating walls of the cavity. Optionally, a probe located above the cavity is printed on a lamina belonging to the PCB. In one embodiment, the cavity guides millimeter-waves injected by the probe at one side of the cavity to the other side of the cavity.

In one embodiment, a system for guiding millimeter-waves through a PCB includes a plurality of VIA holes passing through at least one lamina of a pressed laminate structure belonging to a PCB. The holes are placed side by side forming a contour of a waveguide aperture, and the lamina is at least partially transparent to at least a range of millimeter-wave frequencies. Optionally, the VIA holes are plated or filled with an electrically conductive material, forming an electrically conductive cage enclosing the contour of the waveguide aperture. Optionally, a probe is located above the electrically conductive cage, and printed on a lamina belonging to the laminate structure. In one embodiment, the electrically conductive cage guides millimeter-waves, transmitted by the probe, through the at least one lamina.

In one embodiment, a system for injecting and guiding millimeter-waves through a PCB includes at least two laminas belonging to a PCB. The laminas are optionally contiguous and electrically insulating. An electrically conductive plating is applied on the insulating walls of a cavity formed perpendicularly through the laminas. The electrically conductive plating and the cavity form a waveguide. An antenna is embedded inside an Integrated Circuit. The antenna is located above the cavity. Optionally, the Integrated Circuit is soldered to electrically conductive pads printed on a lamina belonging to the PCB and located above the laminas through which the cavity is formed. In one embodiment, the cavity guides millimeter-waves injected by the antenna at one side of the cavity to the other side of the cavity.

In one embodiment, the Integrated Circuit is a flip-chip or Solder-Bumped die, the antenna is an integrated patch antenna, and the integrated patch antenna is configured to radiate towards the cavity. In one embodiment, electrically conductive surfaces are printed on the at least two laminas, the surfaces extending outwards from the cavity, and are electrically connected to the electrically conductive plating. Optionally, VIA holes go through the at least two laminas and the electrically conductive surfaces, the VIA holes are optionally plated or filled with electrically conductive material electrically connected to the electrically conductive surfaces, and the VIA holes are located around the cavity forming an electrically conductive cage extending the waveguide above the cavity towards the Integrated Circuit. In one embodiment, at least some of the electrically conductive pads are ground pads electrically connected to ground bumps of the Flip Chip or Solder Bumped Die, and the VIA holes extending from the waveguide reaching the ground pads. Optionally, the electrically conductive material is electrically connected to the ground bumps of the Flip Chip or Solder Bumped Die.

BRIEF DESCRIPTION OF THE DRAWINGS

The embodiments are herein described, by way of example only, with reference to the accompanying drawings. No attempt is made to show structural details of the embodiments in more detail than is necessary for a fundamental understanding of the embodiments. In the drawings:

FIG. 11A illustrates some electrically conductive elements of a discrete waveguide, a probe, a backshort, and a plurality of Vertical Interconnect Access holes forming an electrically conductive cage;

FIG. 11B illustrates a discrete waveguide;

FIG. 11C illustrates a lateral cross-sections of a discrete waveguide, a probe, a backshort, and a plurality of Vertical Interconnect Access holes forming an electrically conductive cage;

DETAILED DESCRIPTION OF THE INVENTION

Figure 1A:
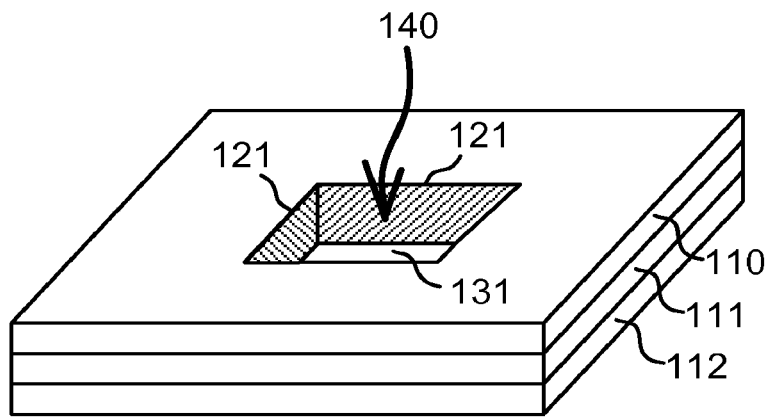
FIG. 1A illustrates one embodiment of a laminate waveguide structure.

It is noted that: (i) same features throughout the drawing figures will be denoted by the same reference label and are not necessarily described in detail in every drawing that they appear in, and (ii) a sequence of drawings may show different aspects of a single item, each aspect associated with various reference labels that may appear throughout the sequence, or may appear only in selected drawings of the sequence.

Figure 1B:
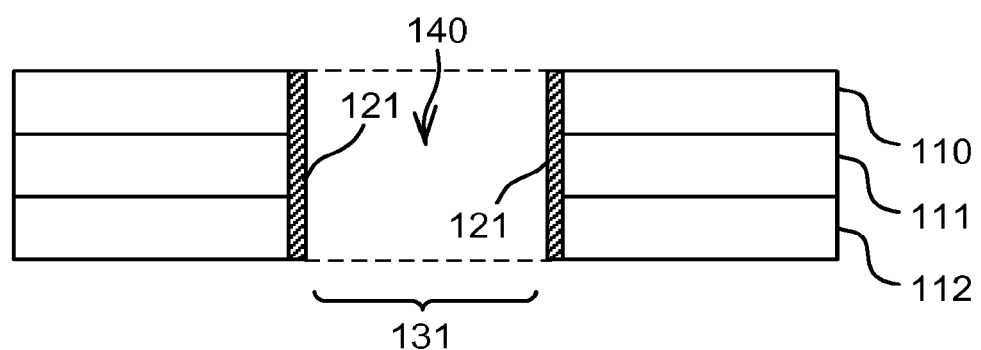
FIG. 1B illustrates a lateral cross-section of a laminate waveguide structure.

FIG. 1A and FIG. 1B illustrate one embodiment of a laminate waveguide structure configured to guide millimeter-waves through laminas. FIG. 1B is a lateral cross-section of a laminate waveguide structure illustrated by FIG. 1A. Typically such structure shall include at least two laminas. In FIG. 1A and FIG. 1B three laminas 110, 111, 112 belonging to a laminate waveguide structure are illustrated by way of example. A cavity 131 is formed perpendicularly through the laminas. An electrically conductive plating 121 is applied on the insulating walls of cavity 131. The electrically conductive plating 121 may be applied using PCB manufacturing techniques, or any other techniques used to deposit or coat an electrically conductive material on inner surfaces of cavities made in laminas. The cavity 131 is operative to guide millimeter-waves 140 injected at one side of the cavity to the other side of the cavity. In one embodiment, the laminas 110, 111, and 112 belong to a Printed Circuit Board (PCB).

Figure 2A:
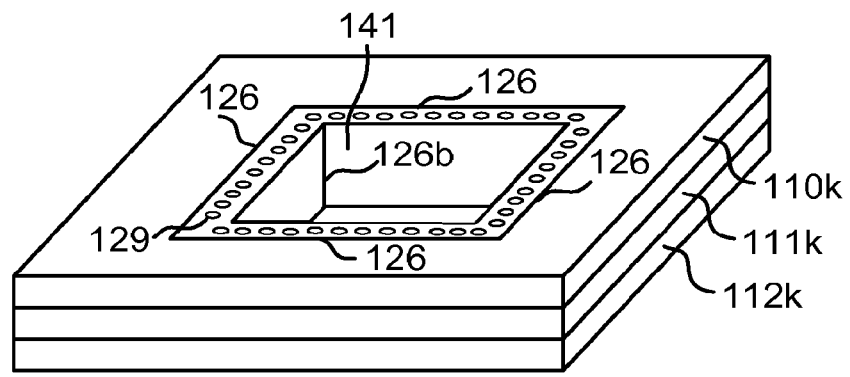
FIG. 2A illustrates one embodiment of a laminate waveguide structure.
Figure 2B:
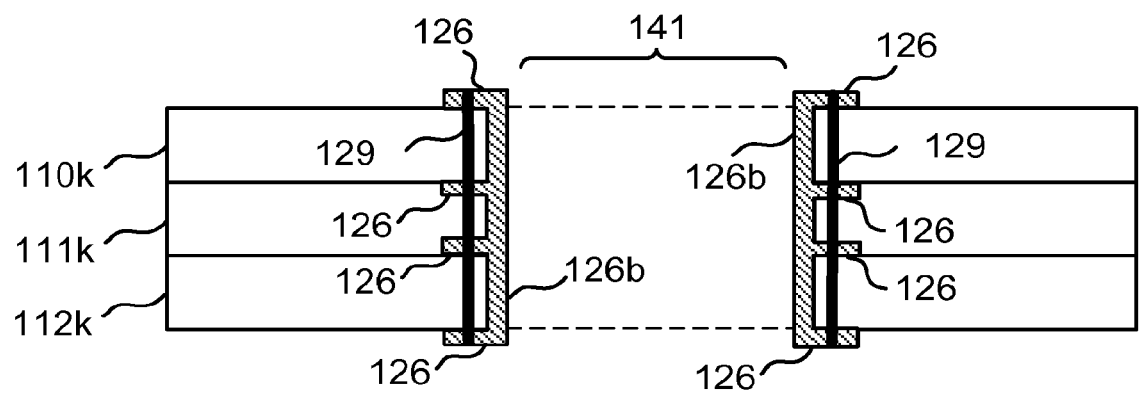
FIG. 2B illustrates a lateral cross-section of a laminate waveguide structure.

FIG. 2A and FIG. 2B illustrate one embodiment of a laminate waveguide structure configured to guide millimeter-waves through the laminas of the structure. FIG. 2B is a lateral cross-section of a laminate waveguide structure illustrated by FIG. 2A. Electrically conductive surfaces 126 are printed on at least two laminas illustrated as three laminas 110k, 111k, 112k by way of example. The electrically conductive surfaces 126 extend outwards from an electrically conductive plating 126b applied on an inner surface of a cavity 141 formed perpendicularly through the laminas of the laminate waveguide structure. The electrically conductive surfaces 126 are electrically connected to the electrically conductive plating 126b. The electrically conductive surfaces 126 may be printed on the laminas using any appropriate technique used in conjunction with PCB technology. Optionally, Vertical Interconnect Access (VIA) holes 129 go through the laminas 110k, 111k, 112k and the electrically conductive surfaces 126. The VIA holes 129 may be plated or filled with electrically conductive material connected to the electrically conductive surfaces 126, and are located around the cavity 141 forming an electrically conductive cage. In one embodiment, the electrically conductive cage is operative to enhance the conductivity of the electrically conductive plating 126b. In one embodiment, the cavity 141 is operative to guide millimeter-waves injected at one side of the cavity to the other side of the cavity.

In one embodiment, the cavity 141 is dimensioned to form a waveguide having a cutoff frequency above 20 GHz. In one embodiment, the cavity 141 is dimensioned to form a waveguide having a cutoff frequency above 50 GHz. In one embodiment, the cavity 141 is dimensioned to form a waveguide having a cutoff frequency above 57 GHz.

In one embodiment, a system for injecting and guiding millimeter-waves through a Printed Circuit Board (PCB) includes at least two laminas belonging to a PCB. An electrically conductive plating is applied on the insulating walls of a cavity formed perpendicularly through the at least two laminas. Optionally, a probe is located above the cavity printed on a lamina belonging to the PCB. In one embodiment, the cavity guides millimeter-waves injected by the probe at one side of the cavity to the other side of the cavity.

In one embodiment, electrically conductive surfaces are printed on the at least two laminas, the electrically conductive surfaces extend outwards from the cavity, and are electrically connected to the electrically conductive plating. At least 10 Vertical Interconnect Access (VIA) holes go through the at least two laminas and the electrically conductive surfaces. The VIA holes are plated or filled with electrically conductive material, which is connected to the electrically conductive surfaces, and the VIA holes are located around the cavity forming an electrically conductive cage.

Figure 3A:
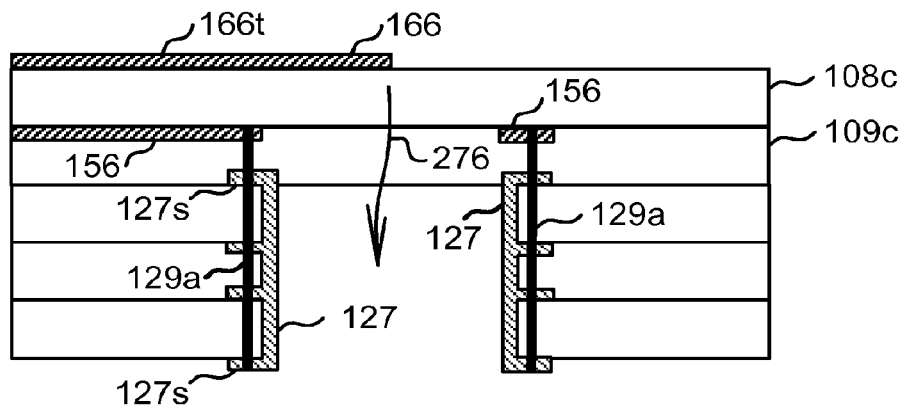
FIG. 3A illustrates a lateral cross-section of a probe printed on a lamina and a laminate waveguide structure.
Figure 3B:
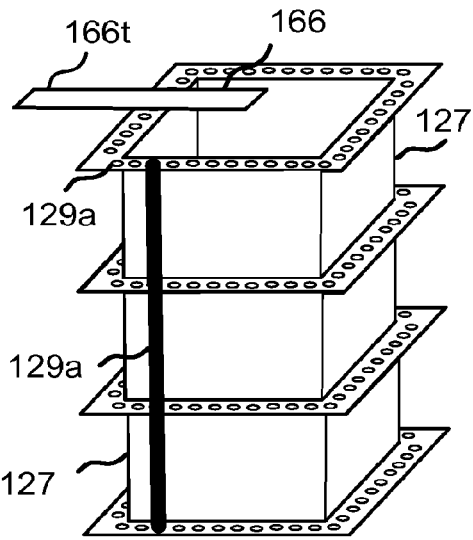
FIG. 3B illustrates some electrically conductive elements of a probe printed on a lamina and some electrically conductive elements of a laminate waveguide structure.
Figure 3C:
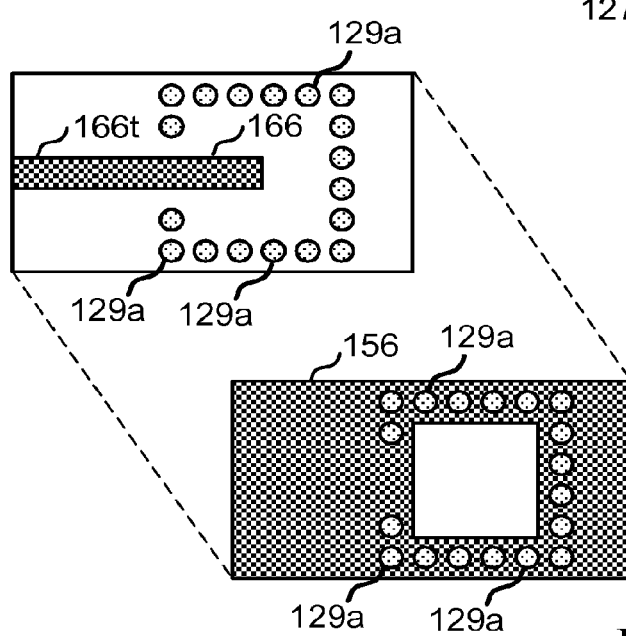
FIG. 3C illustrates a top view of a transmission line signal trace reaching a probe, and a ground trace or a ground layer.

FIG. 3A, FIG. 3B, and FIG. 3C illustrate one embodiment of a probe 166 printed on a lamina 108c (FIG. 3A) and configured to radiate millimeter-waves 276 (FIG. 3A) into a laminate waveguide structure similar to the laminate waveguide structure illustrated by FIG. 2A and FIG. 2B. The probe 166 is located above the laminate waveguide structure, such that at least some of the energy of the millimeter-waves 276 is captured and guided by the laminate waveguide structure. Optionally, the probe 166 is simply a shape printed on one of the laminas 108c as an electrically conductive surface, and configured to convert signals into millimeter-waves 276. It is noted that whenever a probe is referred to as transmitting or radiating, it may also act as a receiver of electromagnetic waves. In such a case, the probe converts received electromagnetic waves into signals. Waveguides and laminate waveguide structures are also operative to guide waves towards the probe.

In one embodiment, lamina 108c used to carry the probe 166 on one side, is also used to carry a ground trace 156 (FIG. 3A, FIG. 3B) on the opposite side, and the lamina 108c carrying probe 166 is made out of a soft laminate material suitable to be used as a millimeter-wave band substrate in PCB. It is noted that the term "ground trace" and the term "ground layer" are used interchangeably. In one embodiment, lamina 108c, which carries probe 166 and ground trace 156 or ground layer 156 and acts as a substrate, is made out of a material selected from a group of soft laminate material suitable to be used as a millimeter-wave band substrate in PCB, such as Rogers® 4350B laminate material available from Rogers Corporation Chandler, Ariz., USA, Arlon CLTE-XT laminate material, or Arlon AD255A laminate material available from ARLON-MED Rancho Cucamonga, Calif., USA. Such material does not participate in the electromagnetic signal path of millimeter-waves. In one embodiment, only the probe carrying lamina 108c is made out of soft laminate material suitable to be used as a millimeter-wave band substrate in PCB, while the rest of the laminas in the PCB, such as 109c, may be made out of more conventional materials such as FR-4.

Figure 3D:
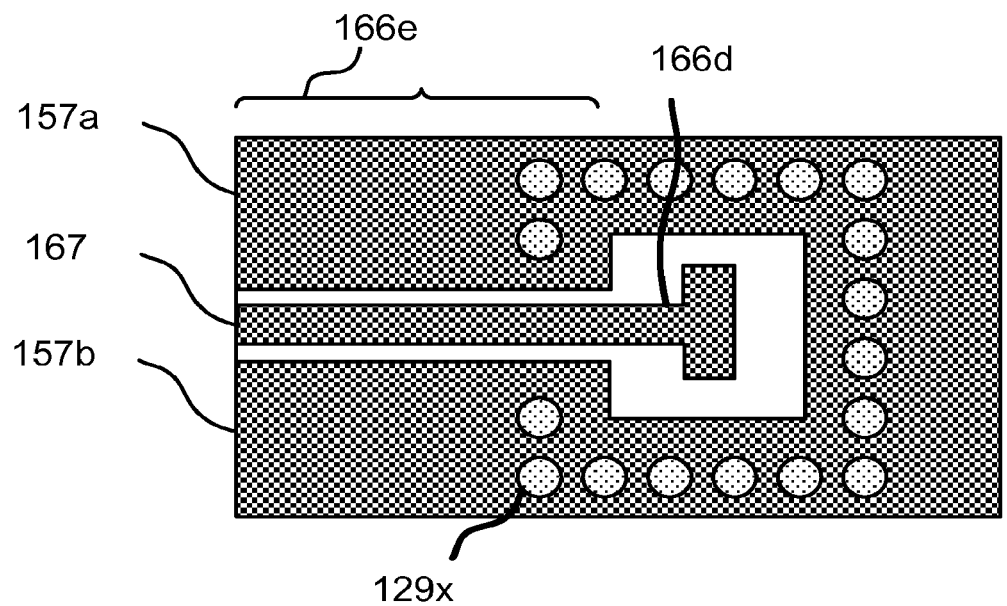
FIG. 3D illustrates a top view of a coplanar waveguide transmission Line reaching a probe.

FIG. 3D illustrates one embodiment of a printed Coplanar-Waveguide-Transmission-Line 166e reaching a probe 166d. Probe 166d may be used instead of probe 166. The ground 157a—signal 167—ground 157b structure makes a good candidate for interfacing to millimeter-wave device ports. VIA holes 129x are similar to vial holes 129a.

In one embodiment, a system for injecting and guiding millimeter-waves through a PCB includes at least one lamina belonging to a PCB. The at least one lamina includes a cavity shaped in the form of a waveguide aperture. An electrically conductive plating is applied on the insulating walls of the cavity. Optionally a probe is located above the cavity and printed on a lamina belonging to the PCB. In one embodiment, the cavity guides millimeter-waves injected by the probe at one side of the cavity to the other side of the cavity.

Figure 3E:
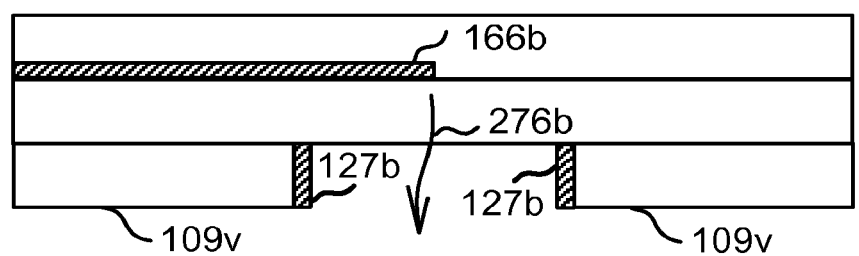
FIG. 3E illustrates a lateral cross-section of a probe and a laminate waveguide structure comprising one lamina.

FIG. 3E illustrates one embodiment of a probe 166b configured to radiate electromagnetic millimeter-waves 276b into a laminate waveguide structure comprising one lamina 109v having a cavity. Electrically conductive plating 127b is applied on the inner walls of the cavity. The probe 166b is optionally located above the laminate waveguide structure, such that at least some of the energy of the millimeter-waves 276b is captured and guided by the laminate waveguide structure. In one embodiment, the probe 166b is of a Monopole-Feed type. In one embodiment, the probe 166b is of a Tapered-Slotline type. In one embodiment, a transmission line signal trace reaching the probe belongs to a Microstrip. It is noted that a probe is usually illustrated as the ending of a transmission line, wherein the ending is located above a waveguide aperture. However, a probe may also be simply a portion of a transmission line such as a Microstrip, wherein the portion passes over the aperture without necessarily ending above the aperture. In this case, the portion of the line departs from a ground layer or ground traces when passing over the aperture; this departure produces millimeter-waves above the aperture when signal is applied.

Referring back to FIG. 3A, in one embodiment, the conductivity of the electrically conductive plating 127 forming the inner surface of the waveguide is enhanced using a VIA cage comprising VIA holes 129a filled or plated with electrically conductive material. In one embodiment, a ground layer 156 or at least one ground trace associated with a transmission line signal trace 166t forms a transmission line for millimeter waves, the transmission line reaching the probe 166. Optionally, the ground layer 156 is electrically connected to at least one electrically conductive surface 127s, and the transmission line carries a millimeter-wave signal from a source connected to one end of the transmission line to the probe 166. In one embodiment, VIA holes 129a filled with electrically conductive material electrically connect the electrically conductive plating 127 to the ground layer or ground trace 156. In one embodiment, the at least two laminas are PCB laminas, laminated together by at least one prepreg lamina. In one embodiment, the at least two laminas are PCB laminas, out of which at least one is a prepreg bonding lamina. In one embodiment, some of the VIA holes 129a are used to electrically interconnect a ground trace 156 with electrically conductive plating 127. Ground trace or ground layer 156, together with a transmission line signal trace 166t reaching the probe 166, may form a transmission line configured to carry a millimeter-wave signal from a source into the laminate waveguide structure.

In one embodiment, lamina 108c may be laminated to one of the laminas of the waveguide structure using a prepreg bonding lamina (element 109c), such as FR-2 (Phenolic cotton paper), FR-3 (Cotton paper and epoxy), FR-4 (Woven glass and epoxy), FR-5 (Woven glass and epoxy), FR-6 (Matte glass and polyester), G-10 (Woven glass and epoxy), CEM-1 (Cotton paper and epoxy), CEM-2 (Cotton paper and epoxy), CEM-3 (Woven glass and epoxy), CEM-4 (Woven glass and epoxy) or CEM-5 (Woven glass and polyester). It is noted that the term "lamina" is used in association with both substrate laminas and prepreg bonding laminas throughout the spec. A laminate structure may comprise a combination of both types of laminas, as usually applicable to PCB. It is noted that the lamina related processes associated with making VIA holes, cavities, electrically conductive plating, and printing of electrically conductive surfaces, are well known in the art, and are readily implemented in the PCB industry.

In one embodiment, electrically conductive surfaces 127s are printed on laminas associated with electrically conductive plating 127. The surfaces 127s extend outwards from a cavity and are electrically connected to the electrically conductive plating 127. A ground layer or a ground trace 156 associated with a transmission line signal trace 166t forms a transmission line for millimeter-waves, the transmission line reaching the probe 166. Optionally, the ground trace 156 is electrically connected to at least one of the electrically conductive surfaces 127s, and the transmission line carries a millimeter-wave signal from a source connected to one end of the transmission line to the probe 166.

It is noted that throughout the specifications conductive surfaces, probes, traces, or layers may be referred to as being printed. Printing may refer to any process used to form electrically conductive shapes on laminas of PCB, such as chemical etching, mechanical etching, or direct-to-PCB inkjet printing.

Figure 4A:
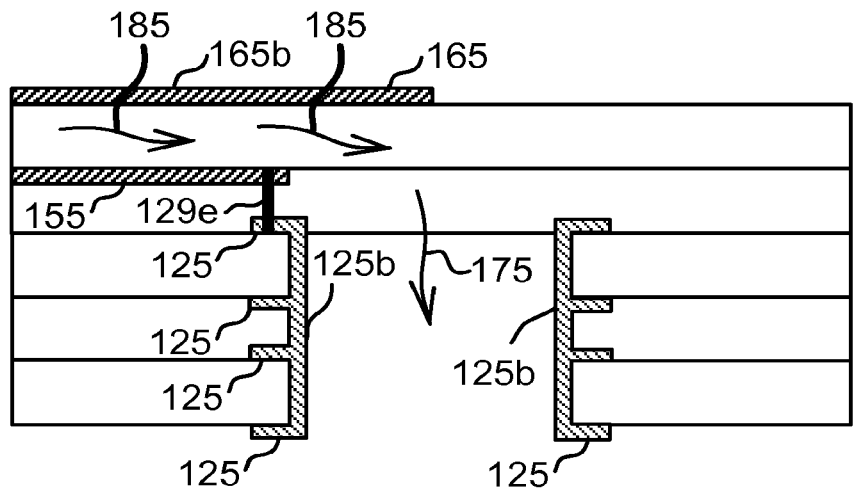
FIG. 4A illustrates a lateral cross-section of a probe printed on a lamina and a laminate waveguide structure.
Figure 4B:
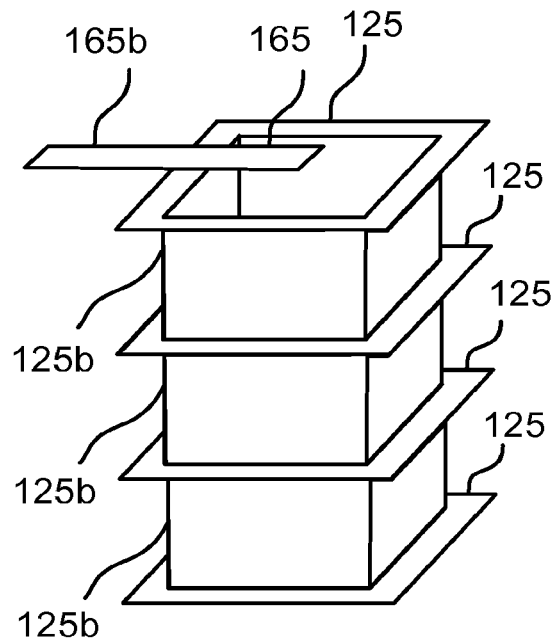
FIG. 4B illustrates some electrically conductive elements of a probe printed on a lamina and some electrically conductive elements of a laminate waveguide structure.

FIG. 4A and FIG. 4B illustrate one embodiment of a laminate structure configured to guide millimeter-waves through the laminas of the structure. Electrically conductive surfaces 125 are printed on at least two laminas. The surfaces extend outwards from an electrically conductive plating 125b applied on an inner surface of a cavity formed within the laminate structure. The surfaces are electrically connected to the electrically conductive plating 125b. Referring now to FIG. 4A, the cavity is operative to guide millimeter-waves 175 injected by a probe 165 at one side of the cavity to the other side of the cavity. Optionally, a ground layer or a ground trace 155 associated with a transmission line signal trace 165b, forms a transmission line for millimeter-waves. Optionally, the ground layer or ground trace 155 is electrically connected to at least one of the electrically conductive surfaces 125 using VIA holes 129e filled with electrically conductive material. Alternatively, the ground layer or ground trace 155 is a surface printed on the same side of a lamina carrying one of the electrically conductive surfaces 125, and the one of the electrically conductive surfaces 125 is a continuation of the ground layer or ground trace 155. Optionally, the transmission line is configured to carry a millimeter-wave signal 185 from one end of transmission line signal trace 165b to the probe 165. Millimeter-wave signal 185 is then converted by probe 165 into millimeter-waves 175.

In one embodiment, a receiver probe is located below a cavity, and printed on a lamina belonging to a laminate structure. The receiver probe receives millimeter-waves injected to the cavity by a probe located above the cavity.

Figure 5:
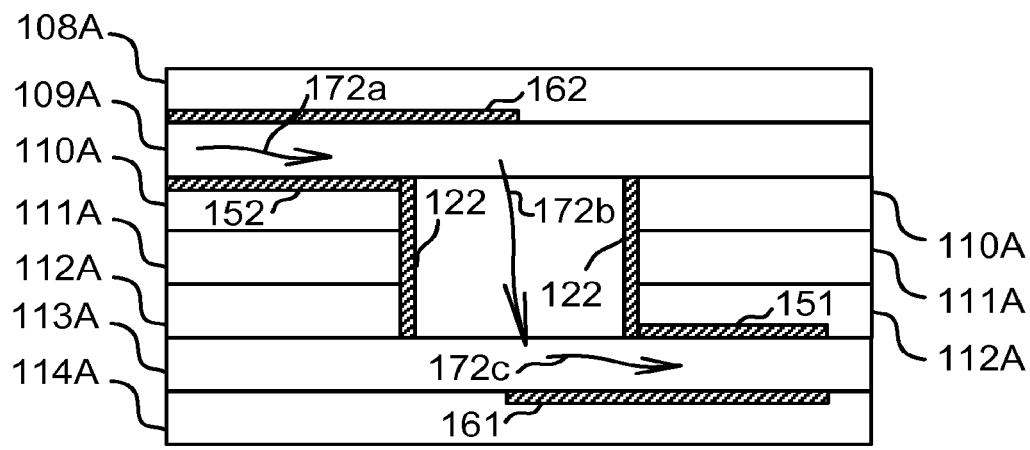
FIG. 5 illustrates a cross-section of a laminate waveguide structure and two probes.

FIG. 5 illustrates one embodiment of a laminate structure configured to generate millimeter-waves 172b, inject them through one end of a cavity formed within the laminate structure, guide the millimeter—waves 172b through the cavity, and receive them at the other end of the cavity. An exemplary laminate structure comprising laminas 108A, 109A, 110A, 111A, 112A, 113A and 114A, a cavity, plated with electrically conductive plating 122, is formed within laminas 110A, 111A and 112A, a probe 162 printed on lamina 109A above the cavity, and a receiving probe 161 printed on lamina 113A below the cavity. Millimeter-wave signal 172a is carried by the probe 162 over the cavity, and radiated into the cavity as millimeter-waves 172b. Optionally, the millimeter-waves 172b are picked up by the receiving probe 161, which converts it back into a millimeter-wave signal 172c carried by the receiving probe 161. Ground layers or ground traces 152, 151, electrically coupled to the electrically conductive plating, may be used to form transmission lines reaching probe 162 and receiving probe 161 respectively. The transmission lines may be used in carrying the signals 172a and 172c. It is noted that the signal path is reciprocal, such that receiving probe 161 may radiate waves to be received by probe 162 via the waveguide.

In one embodiment, a discrete waveguide is located below the cavity and as a continuation to the cavity. The discrete waveguide passes-through waves guided by the cavity into the discrete waveguide.

Figure 6A:
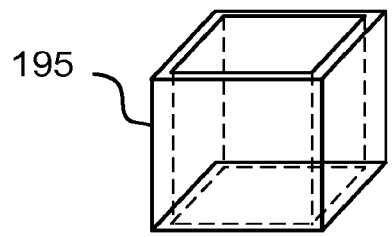
FIG. 6A illustrates a discrete waveguide.
Figure 6B:
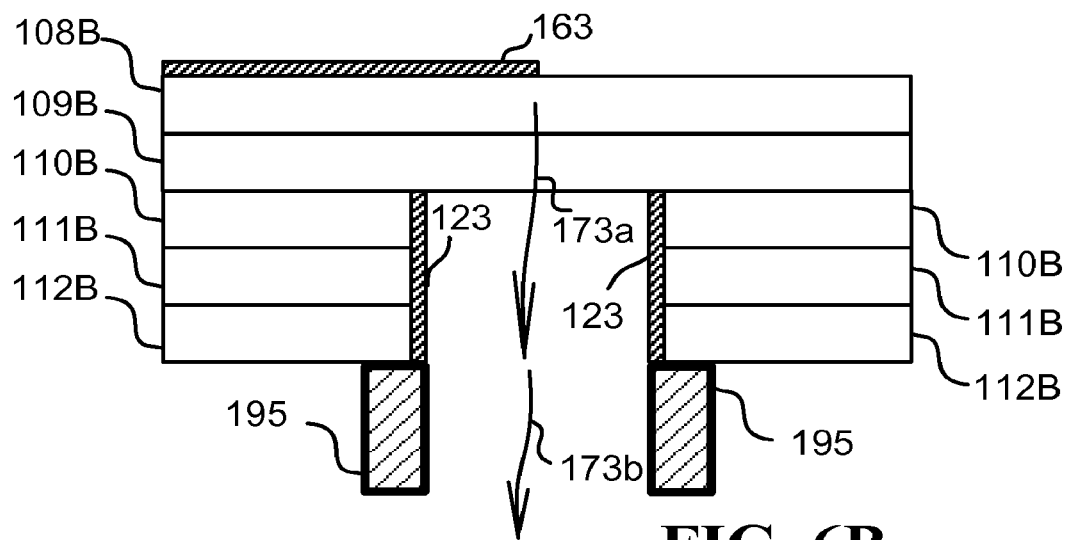
FIG. 6B illustrates a lateral cross-section of a probe, a laminate waveguide structure, and a discrete waveguide.

FIG. 6A illustrates one embodiment of a discrete waveguide 195. FIG. 6B illustrates one embodiment of a laminate structure configured to generate millimeter-waves, inject the waves through one end of a cavity formed within a laminate structure, and guide the waves through the cavity into a discrete waveguide attached as continuation to the cavity. An exemplary laminate structure comprising laminas 108B, 109B, 110B, 111B and 112B, a cavity formed within laminas 110B, 111B and 112B; the cavity is plated with electrically conductive plating 123, a probe 163 printed on lamina 108B, and a discrete waveguide 195 attached to lamina 112B, such that the apertures of the discrete waveguide and the cavity substantially overlap. Optionally, millimeter-wave signal 173a is radiated by the probe 163 into the cavity, and propagates through the cavity as millimeter-waves 173a. Optionally, millimeter-waves 173a then enter the discrete waveguide, and continues propagating there as millimeter-waves 173b.

In one embodiment, a system for injecting and guiding millimeter-waves through a PCB includes a plurality of VIA holes passing through at least two laminas of a laminate structure belonging to a PCB. The VIA holes are placed side by side forming a contour of a waveguide aperture, and the laminas are at least partially transparent to at least a range of millimeter-wave frequencies. The VIA holes are plated or filled with an electrically conductive material, forming an electrically conductive cage enclosing the contour of the waveguide aperture. Optionally, the system further includes a probe located above the electrically conductive cage, and printed on a lamina belonging to the laminate structure.

In one embodiment, the electrically conductive cage guides millimeter-waves, transmitted by the probe, through the at least two laminas.

Figure 7A:
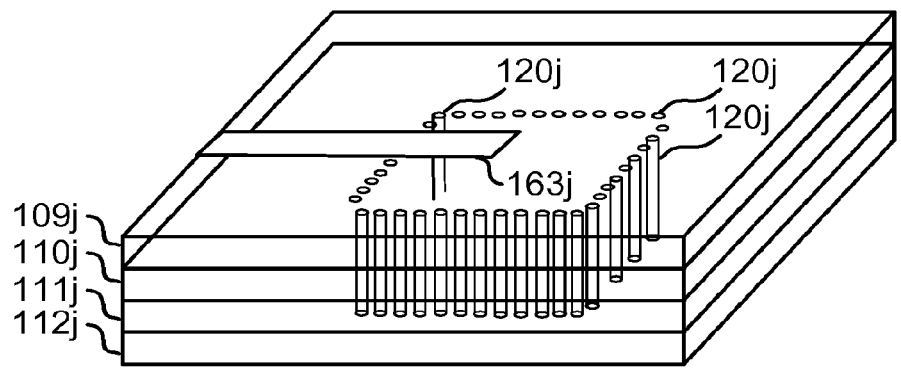
FIG. 7A illustrates one embodiment of a probe and a laminate waveguide structure.
Figure 7B:
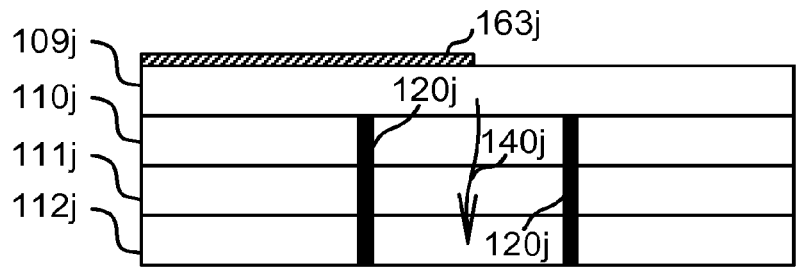
FIG. 7B illustrates a cross-section of a laminate waveguide structure and a probe.

FIG. 7A and FIG. 7B illustrate one embodiment of a laminate structure configured to guide millimeter-waves through a cage of VIA holes filled with electrically conductive material, embedded within the laminas of the structure. A plurality of VIA holes 120j pass through at least two laminas 110j, 111j, and 112j of a pressed laminate structure belonging to a PCB (three laminas are illustrated by way of example). The VIA holes 120j are placed side by side forming a contour of a waveguide aperture, and the laminas 110j, 111j, 112j are at least partially transparent to at least some frequencies of millimeter-waves. Optionally, the VIA holes 120j are plated or filled with an electrically conductive material, and therefore form an electrically conductive cage enclosing the contour of the waveguide aperture. Optionally, a probe 163j is located above the electrically conductive cage, and printed on lamina 109j belonging to the laminate structure. Optionally, the electrically conductive cage guides millimeter-waves 140j (FIG. 7B) radiated by the probe 163j through the at least two laminas 110j, 111j, and 112j.

In one embodiment, a system for guiding millimeter-waves through a PCB includes a plurality of VIA holes passing through at least one lamina of a pressed laminate structure belonging to a PCB. The VIA holes are placed side by side forming a contour of a waveguide aperture, and the lamina is at least partially transparent to at least a range of millimeter-wave frequencies. Optionally, the VIA holes are plated or filled with an electrically conductive material, forming an electrically conductive cage enclosing the contour of the waveguide aperture. Optionally, a probe is located above the electrically conductive cage, and printed on a lamina belonging to the laminate structure.

In one embodiment, the electrically conductive cage guides millimeter-waves, transmitted by the probe, through the at least one lamina.

Figure 7C:
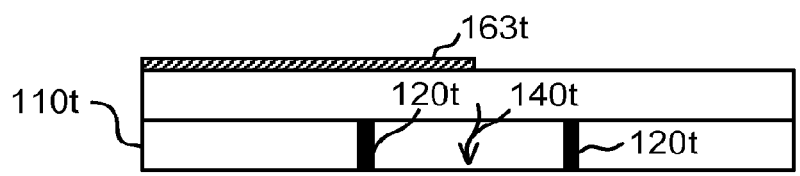
FIG. 7C illustrates a cross-section of a laminate waveguide structure comprising one lamina, and a probe.

FIG. 7C illustrates one embodiment of a laminate structure configured to guide millimeter-waves through an electrically conductive cage of VIA holes filled with electrically conductive material, embedded within at least one lamina of structure PCB. An electrically conductive cage 120t is formed in at least one lamina 110t of the PCB. In one embodiment, the electrically conductive cage 120t forms a waveguide. Optionally, formation of millimeter-waves 140t is facilitated by a probe 163t, and millimeter-waves 140t are guided by the waveguide.

In one embodiment, a cavity is confined by an electrically conductive cage, the cavity going through at least two laminas, and millimeter-waves are guided through the cavity.

Figure 8:
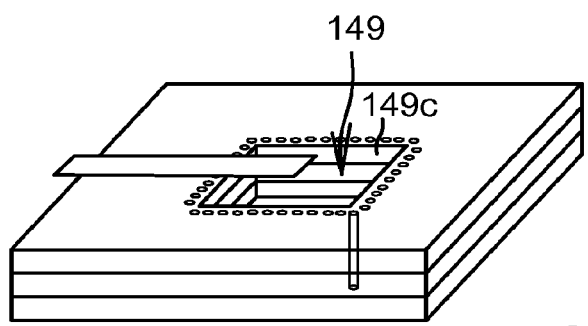
FIG. 8 illustrates one embodiment of a laminate waveguide structure.

FIG. 8 illustrates one embodiment of the laminate structure illustrated by FIGS. 7A and 7B, with the exception that a cavity 149c is formed perpendicularly through at least two laminas, and millimeter waves 149 are guided by an electrically conductive cage, made from VIA voles, through the cavity.

In one embodiment, electrically conductive surfaces are printed on the at least two laminas, such that the VIA holes pass through the electrically conductive surfaces, and the electrically conductive surfaces enclose the contour.

Figure 9A:
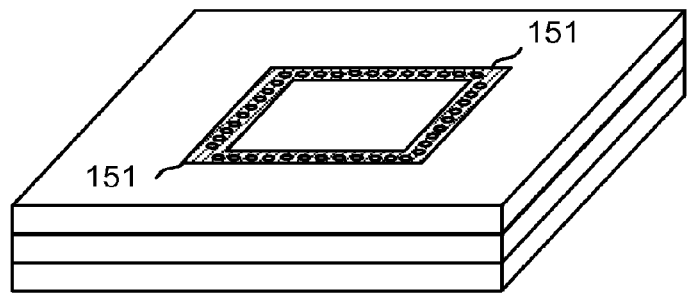
FIG. 9A illustrates one embodiment of a probe and a laminate waveguide structure.
Figure 9B:
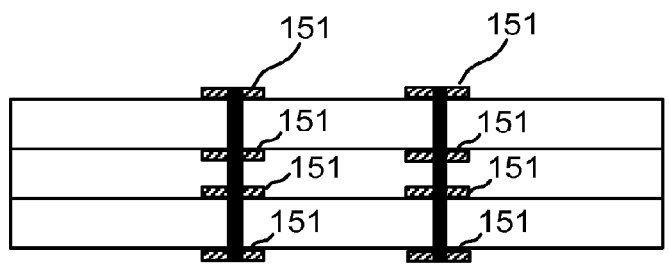
FIG. 9B illustrates a lateral cross-section of a waveguide laminate structure.

FIG. 9A and FIG. 9B illustrate one embodiment of the laminate structure illustrated by FIG. 7A and FIG. 7B, with the exception that electrically conductive surfaces 151 are printed on at least two laminas. VIA holes pass through the electrically conductive surfaces 151, such that the electrically conductive surfaces 151 enclose the contour of the waveguide aperture.

In one embodiment, a system for injecting and guiding millimeter-waves through a PCB includes at least two laminas belonging to a PCB. The laminas are optionally contiguous and electrically insulating. An electrically conductive plating is applied on the insulating walls of a cavity formed perpendicularly through the laminas. The electrically conductive plating and the cavity form a waveguide. An antenna is embedded inside an Integrated Circuit. The antenna is located above the cavity. The Integrated Circuit is optionally soldered to electrically conductive pads printed on a lamina belonging to the PCB and located above the laminas through which the cavity is formed.

In one embodiment, the cavity guides millimeter-waves injected by the antenna at one side of the cavity to the other side of the cavity.

In one embodiment, the Integrated Circuit is a flip-chip or Solder-Bumped die, the antenna is an integrated patch antenna, and the integrated patch antenna is configured to radiate towards the cavity.

Figure 10A:
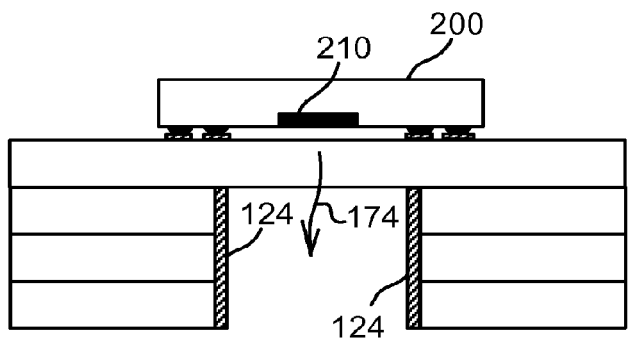
FIG. 10A illustrates a lateral cross-section of a laminate waveguide structure, and an Integrated Circuit comprising antenna.

FIG. 10A illustrates one embodiment of a laminate waveguide structure comprising electrically conductive plating 124, configured to guide millimeter-waves 174, in accordance with some embodiments. An Integrated Circuit 200 comprising an antenna 210 is used to radiate millimeter-waves 174 into a cavity formed though laminas. Optionally, an antenna 210 is located above the laminas though which the cavity is formed, and the Integrated Circuit 200 is optionally soldered to pads printed on a lamina located above the laminas though which the cavity is formed. In one embodiment, the Integrated Circuit 200 is a flip-chip or Solder-Bumped die, the antenna 210 is an integrated patch antenna, and the integrated patch antenna is configured to radiate towards the cavity.

In one embodiment, electrically conductive surfaces are printed on the at least two laminas, the electrically conductive surfaces extending outwards from the cavity, and are electrically connected to the electrically conductive plating. VIA holes go through the at least two laminas and the electrically conductive surfaces, the VIA holes are optionally plated or filled with electrically conductive material electrically connected to the electrically conductive surfaces, and the VIA holes are located around the cavity forming an electrically conductive cage extending the waveguide above the cavity towards the Integrated Circuit.

In one embodiment, at least some of the electrically conductive pads are ground pads electrically connected to ground bumps of the Flip Chip or Solder Bumped Die, and the VIA holes extending from the waveguide reaching the ground pads. Optionally, the electrically conductive material is electrically connected to the ground bumps of the Flip Chip or Solder Bumped Die.

Figure 10B:
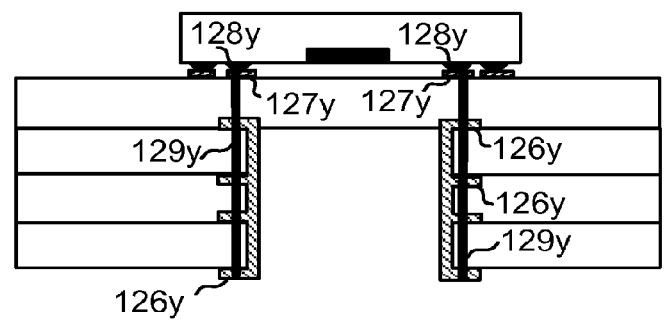
FIG. 10B illustrates a lateral cross-section of a laminate waveguide structure, and an Integrated Circuit comprising antenna.

FIG. 10B illustrates one embodiment of the laminate waveguide structure illustrated by FIG. 10A, with the exception that electrically conductive surfaces 126y are printed on at least two of the laminas, extending outwards from the cavity, and are electrically connected to the electrically conductive plating. VIA holes 129y go through the at least two laminas and the electrically conductive surfaces 126y. Optionally, the VIA holes 129y are plated or filled with electrically conductive material electrically connected to the electrically conductive surfaces 126y, and the VIA holes 129y located around the cavity forming an electrically conductive cage in accordance with some embodiments.

In one embodiment, the electrically conductive cage extends above the cavity and lengthens the laminate waveguide structure. In one embodiment the electrically conductive cage extends to the top of the PCB through ground pads 127y on the top lamina. In one embodiment the electrically conductive cage connects to ground bumps 128y of the Integrated Circuit, creating electrical continuity from the ground bumps 128y of the Integrated Circuit to the bottom end of the cavity.

In one embodiment, electrically conductive cage made from VIA holes within a PCB extends the length of a waveguide attached to the PCB. The cage seals the waveguide with an electrically conductive surface attached to the VIA cage. The electrically conductive surface is printed on one of the laminas of the PCB, such that both the electrically conductive cage and the electrically conductive surface are contained within the PCB. Optionally, a probe is printed on one of the laminas of the PCB. The probe is located inside the electrically conductive cage, such that transmitted radiation is captured by the waveguide, and guided towards the unsealed end of the waveguide.

In one embodiment, a system for directing electromagnetic millimeter-waves towards a waveguide using an electrically conductive formation within a Printed Circuit Board (PCB) includes a waveguide having an aperture, and at least two laminas belonging to a PCB. A first electrically conductive surface is printed on one of the laminas and located over the aperture such that the first electrically conductive surface covers at least most of the aperture. A plurality of Vertical Interconnect Access (VIA) holes are filled or plated with an electrically conductive material electrically connecting the first electrically conductive surface to the waveguide, forming an electrically conductive cage over the aperture. A probe is optionally printed on one of the laminas of the PCB and located inside the cage and over the aperture.

In one embodiment, the system directs millimeter-waves, transmitted by the probe, towards the waveguide. In one embodiment, the waveguide is a discrete waveguide attached to the PCB, and electrically connected to the electrically conductive cage.

FIG. 11A, FIG. 11B, and FIG. 11C illustrate one embodiment of a system configured to direct millimeter-waves towards a discrete waveguide using an electrically conductive formation within a PCB. The PCB is illustrated as having laminas 320, 321, 322, 323 and 324 by way of example, and not as a limitation as shown in FIG. 11C. A discrete waveguide 301 is attached to a lamina 324 belonging to a PCB, optionally via an electrically conductive ground plating 310 printed on lamina 324, and such that the aperture 330 (FIG. 11C) of the discrete waveguide 301 is not covered by the electrically conductive ground plating 310 (FIGS. 11A & 11C). A first electrically conductive surface 313 (FIGS. 11A & 11C), also referred to as a backshort or a backshort surface, is printed on lamina 322, and located over the aperture 330. The first electrically conductive surface 313 has an area at least large enough to cover most of the aperture 330, and optionally cover the entire aperture 330. A plurality of VIA holes 311 (FIGS. 11A & 11C—not all VIA holes are illustrated or have reference numerals), filled or plated with an electrically conductive material, are used to electrically connect the first electrically conductive surface 313 to the discrete waveguide 301. An electrically conductive cage 302 (FIGS. 11A & 11C) is formed over the aperture 330 by a combination of the VIA holes 311 filled or plated with an electrically conductive material and the first electrically conductive surface 313. The electrically conductive cage 302 creates an electrical continuity with the discrete waveguide 301, and substantially seals it electromagnetically. It is noted that the entire electrically conductive cage 302 is formed within the PCB. A probe 312 (FIGS. 11A & 11C) is optionally printed on one of the laminas located between lamina 322 and the discrete waveguide, such as lamina 324. The probe 312 is located inside the electrically conductive cage 302 and over the aperture 330. In one embodiment, the probe 312 enters the electrically conductive cage 302 through an opening 331 that does not contain VIA holes. A signal reaching the probe 312 is radiated by the probe 312 inside the electrically conductive cage 302 as millimeter-waves 335 (FIG. 11C). The electrically conductive cage 302 together with the discrete waveguide 301 are configured to guide the millimeter-waves 335 towards the unsealed end of the discreet waveguide 301. The electrically conductive cage 302 prevents energy loss, by directing radiation energy towards the unsealed end of the discrete waveguide 301.

In one embodiment, the first electrically conductive surface 313 is not continuous, and is formed by a printed net or printed porous structure operative to reflect millimeter-waves.

Figure 12A:
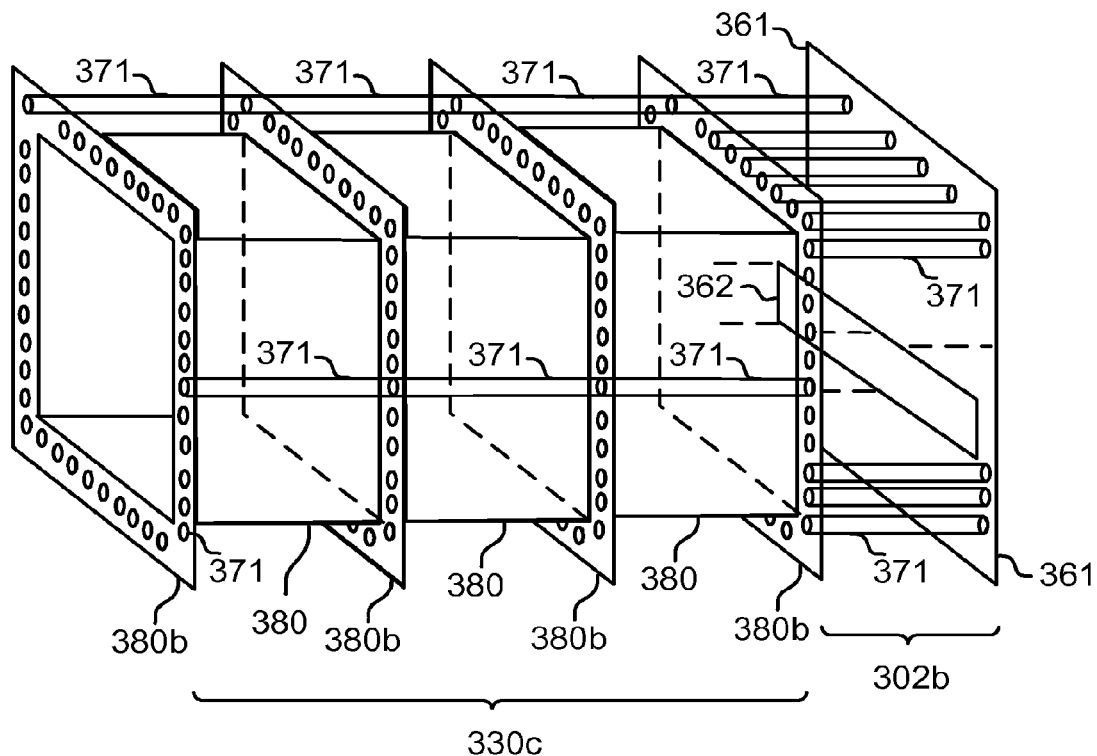
FIG. 12A illustrates some electrically conductive elements of a laminate waveguide structure, a probe, a backshort, and a plurality of Vertical Interconnect Access holes forming an electrically conductive cage.
Figure 12B:
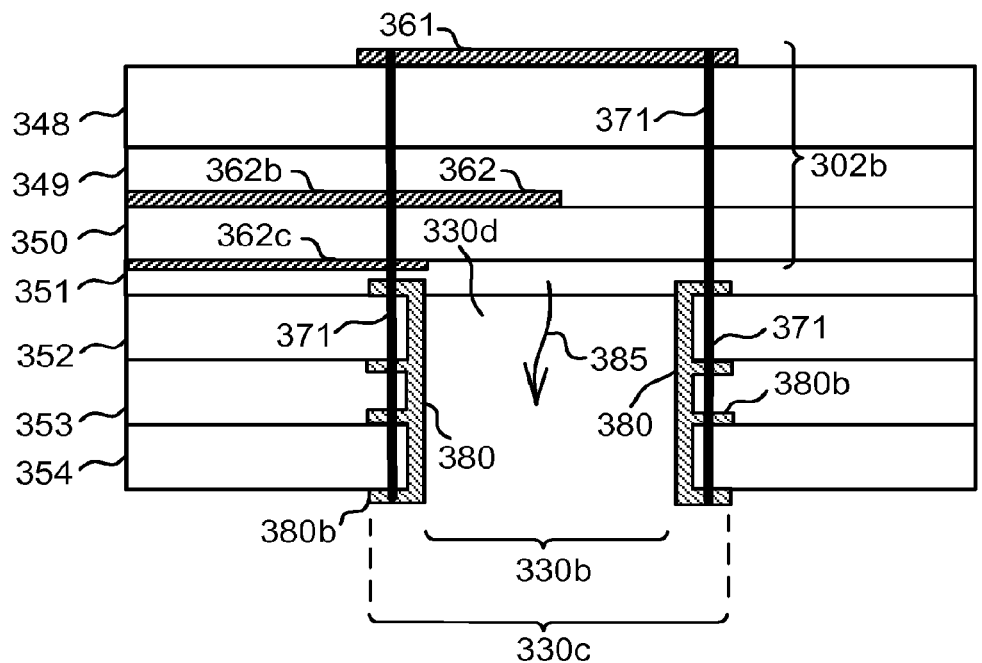
FIG. 12B illustrates a lateral cross-sections of a laminate waveguide structure, a probe, a backshort, and a plurality of Vertical Interconnect Access holes forming an electrically conductive cage.

FIG. 12A and FIG. 12B illustrate one embodiment of a system configured to direct electromagnetic millimeter-waves towards a laminate waveguide structure, using an electrically conductive formation within the PCB. Referring now to FIG. 12B, a laminate waveguide structure 330c is included. As shown in FIG. 12B, the laminate waveguide structure 330c has an aperture 330b. As shown in FIG. 12B, at least two laminas 348, 349, 350 belonging to a PCB are also included. A first electrically conductive surface 361 is printed on one of the laminas, such as lamina 348 in FIG. 12B, and is located over the aperture 330b such that the first electrically conductive surface 361 covers at least most of the aperture 330b. A plurality of Vertical Interconnect Access (VIA) holes 371 are filled or plated with an electrically conductive material electrically connecting the first electrically conductive surface 361 to the laminate waveguide structure 330c, forming an electrically conductive cage 302b over the aperture 330b. A probe 362 (FIGS. 12A & 12B) is optionally printed on one of the laminas of the PCB and located inside the cage 302b and over the aperture 330b.

In one embodiment, as shown in FIG. 12B, the laminate waveguide structure 330c within the PCB includes at least one additional lamina, such as laminas 351, 352, 353, 354 through which the laminate waveguide structure 330c is formed, the at least one additional lamina belongs to the PCB, and has a cavity 330d shaped in the form of the aperture 330b. Optionally, an electrically conductive plating 380 is applied on the walls of the cavity 330d. The cavity 330d is located below the electrically conductive cage 302b.

In one embodiment, additional electrically conductive surfaces 380b are printed on the at least one additional lamina 351, 352, 353, 354. The additional electrically conductive surfaces 380b extend outwards from the cavity 330d, and are electrically connected to the electrically conductive plating 380, wherein the VIA holes 371 extend through the additional electrically conductive surfaces 380b and around the electrically conductive plating 380.

In one embodiment, the thickness of the lamina carrying the first electrically conductive surface, such as lamina 348 in FIG. 12B or lamina 322 in FIG. 11C, is operative to best position the first electrically conductive surface relative to the probe 362 in order to optimize millimeter-wave energy propagation 385 through the waveguide and towards the unsealed end of the waveguide, optionally at a frequency band between 20 GHz and 100 GHz. In one embodiment, the frequency band between 20 GHz and 100 GHz is 57 GHz-86 GHz (29 GHz).

In one embodiment, a ground layer or at least one ground trace 362c associated with a transmission line signal trace 362b forms a transmission line for millimeter-waves, reaching the probe 362. Optionally, the ground trace 362c is electrically connected to at least one of the additional electrically conductive surfaces 380b. In one embodiment, the transmission line carries a millimeter-wave signal from a source connected to one end of the transmission line to the probe 362. In one embodiment, the ground layer or at least one ground trace 362c is connected to at least one of the additional electrically conductive surfaces 380b through at least one of the VIA holes 371, or through at least one additional VIA hole not illustrated.

In one embodiment, the same lamina 350 used to carry the probe 362 on one side, is the lamina used to carry the ground trace 362c on the opposite side. Optionally, the lamina 350 carrying the probe is made out of a soft laminate material suitable to be used as a millimeter-wave band substrate in PCB, such as Rogers® 4350B laminate material, Arlon™ CLTE-XT laminate material, or Arlon AD255A laminate material. In one embodiment, the aperture 330b is dimensioned to result in a laminate waveguide structure 330c having a cutoff frequency above 20 GHz.

Figure 13:
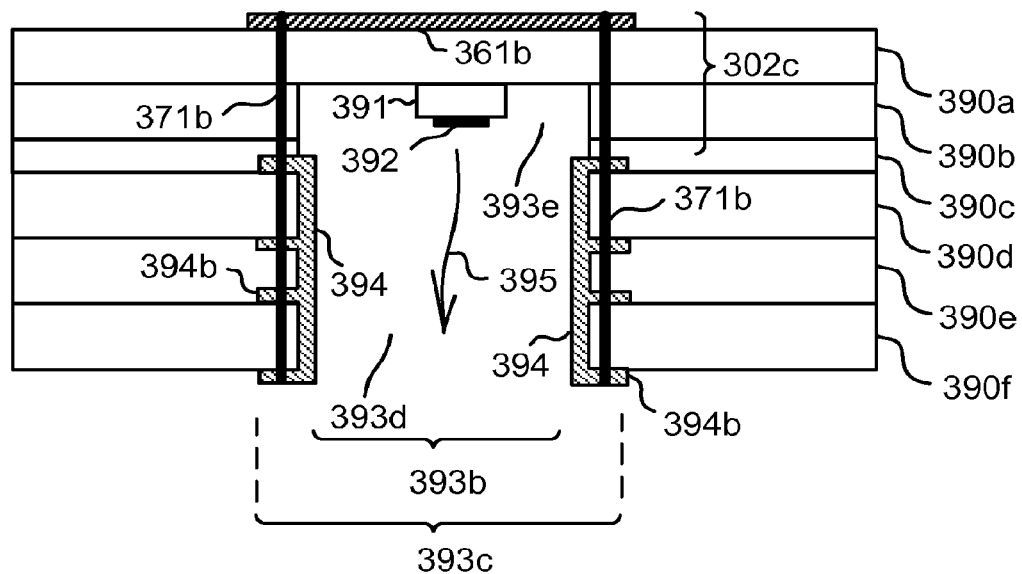
FIG. 13 illustrates a lateral cross-section of a backshort, a laminate waveguide structure, and a millimeter-wave transmitter device comprising an integrated radiating element.

FIG. 13 illustrates one embodiment of a system for directing electromagnetic millimeter-waves towards a waveguide using an electrically conductive formation within a Printed Circuit Board (PCB). The system includes a laminate waveguide structure 393c having an aperture 393b, and at least two laminas 390a, 390b, 390c belonging to a PCB. A first electrically conductive surface 361b is printed on one of the laminas 390a and located over the aperture 393b. The first electrically conductive surface 361b has an area at least large enough to cover most of the aperture 393b. A plurality of Vertical Interconnect Access (VIA) holes 371b are filled or plated with an electrically conductive material, electrically connecting the first electrically conductive surface 361b to the laminate waveguide structure 393c, forming an electrically conductive cage 302c over the aperture 393b. A millimeter-wave transmitter device 391 is optionally placed on one of the laminas 390a, inside a first cavity 393e formed in at least one of the laminas 390b, 390c, and contained inside the electrically conductive cage 302c over the aperture 393b.

In one embodiment, the system directs millimeter-waves 395, transmitted by the millimeter-wave transmitter device 391 using an integrated radiating element 392, towards the laminate waveguide structure 393c.

In one embodiment, the laminate waveguide structure includes at least one additional lamina 390d, 390e, 390f, belonging to the PCB and having a second cavity 393d shaped in the form of the aperture 393b, and an electrically conductive plating 394 applied on walls of the second cavity 393d. The second cavity 393d is located below the electrically conductive cage 302c, and the electrically conductive cage 302c optionally reaches and electrically connects with the electrically conductive plating 394 via additional electrically conductive surfaces 394b extending outwards from the electrically conductive plating 394.

In one embodiment, the electrically conductive cage 302c comprising the first electrically conductive surface 361b prevents energy loss by directing millimeter-waves 395 towards the unsealed end of the laminate waveguide structure 393c.

Figure 14:
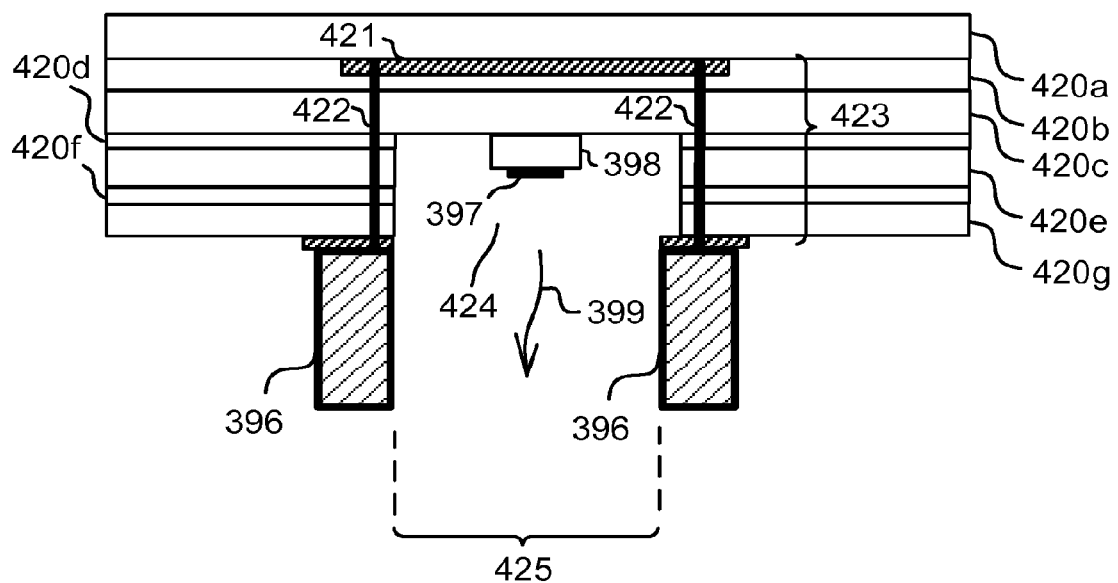
FIG. 14 illustrates a lateral cross-section of a backshort, a discrete waveguide, and a millimeter-wave transmitter device comprising an integrated radiating element.

FIG. 14 illustrates one embodiment of a system for directing electromagnetic millimeter-waves towards a waveguide using an electrically conductive formation within a Printed Circuit Board (PCB). The system includes a waveguide 396 having an aperture 425, and at least two laminas belonging to a PCB 420a, 420b, 420c, 420d, 420e, 420f, 420g. A first electrically conductive surface 421 is printed on one of the laminas 420a and located over the aperture 425, the first electrically conductive surface 421 having an area at least large enough to cover most of the aperture 425. A plurality of Vertical Interconnect Access (VIA) holes 422 are filled or plated with an electrically conductive material and electrically connect the first electrically conductive surface 421 to the waveguide 396, forming an electrically conductive cage 423 over the aperture 425. A millimeter-wave transmitter device 398 is optionally placed on one of the laminas 420c, inside a first cavity 424 formed in at least one of the laminas, 420d, 420e, 420f, 420g, and is contained inside the electrically conductive cage 423 over the aperture 425. In one embodiment, the system directs millimeter-waves 399, transmitted by the millimeter-wave transmitter device 398 using an integrated radiating element 397, towards the waveguide 396. In one embodiment, the waveguide 396 is a discrete waveguide attached to the PCB, and electrically connected to the electrically conductive cage 423. In one embodiment, the area of the first electrically conductive surface 421 is large enough to substantially cover the aperture of a waveguide.

Figure 15:
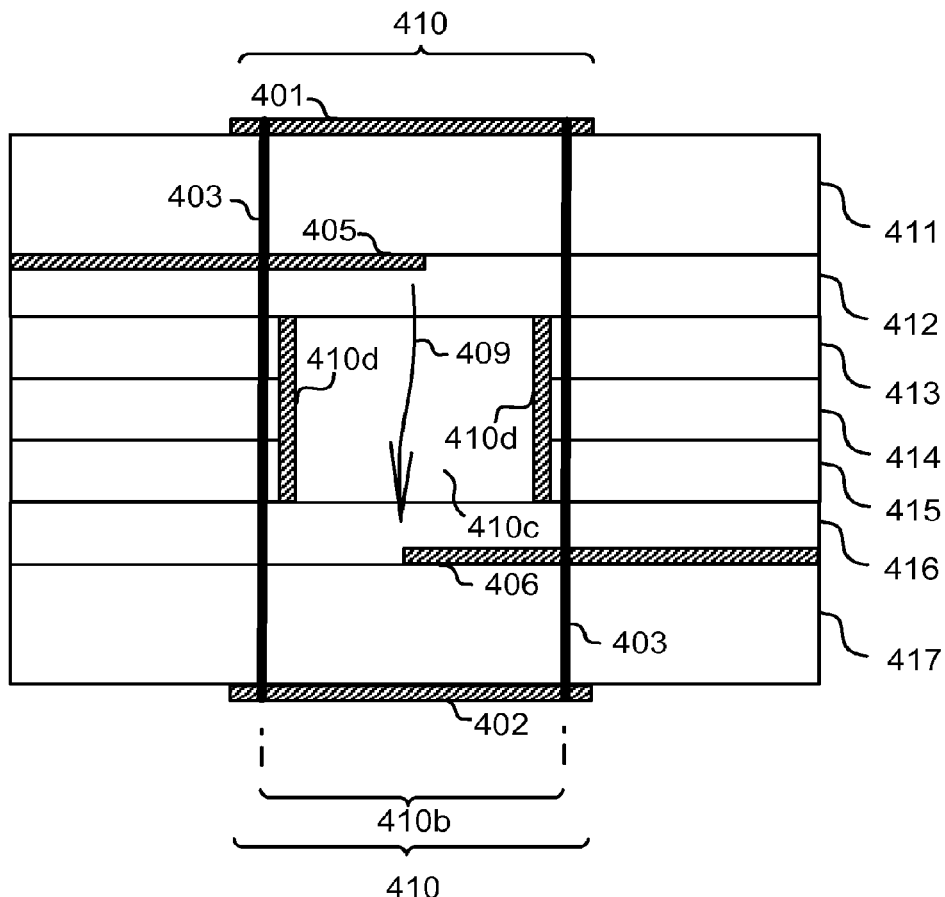
FIG. 15 illustrates one embodiment of a laminate waveguide structure, two probes, and two backshorts.

FIG. 15 illustrates one embodiment of a system for injecting, guiding, and receiving millimeter-waves inside a Printed Circuit Board (PCB). The system includes at least two laminas, illustrated as seven laminas 411, 412, 413, 414, 415, 416, 417 by way of example, belonging to a PCB, and two electrically conductive surfaces 401, 402 printed on the at least two laminas 411, 417, each electrically conductive surface printed on a different lamina. A plurality of Vertical Interconnect Access (VIA) holes 403 are filled or plated with an electrically conductive material, and placed side by side forming a contour of a waveguide aperture 410b. The VIA holes 403, with the electrically conductive material, pass through the laminas 411, 412, 413, 414, 415, 416, 417 contained between the two electrically conductive surfaces 401, 402, and electrically interconnect the two electrically conductive surfaces 401, 402, forming a waveguide 410 sealed from both ends within the PCB. A transmitter probe 405 is optionally located within the waveguide 410, and is printed on one of the at least two laminas 411. A receiver probe 406 is located within the waveguide 410, and is printed on one of the at least two laminas 417 not carrying the transmitter probe 405.

In one embodiment, the receiver probe 406 configured to receive millimeter-waves 409 injected to the waveguide 410 by the transmitter probe 405. In one embodiment, at least two of the laminas 413, 414, 415 located between the transmitter probe 405 and the receiver probe 406 are contiguous, and include a cavity 410c formed in the at least two of the laminas 413, 414, 415. An electrically conductive plating 410d is applied on the walls of the cavity 410c. In one embodiment, the electrically conductive plating 410d enhances the conductivity of the waveguide 410.

Figure 16:
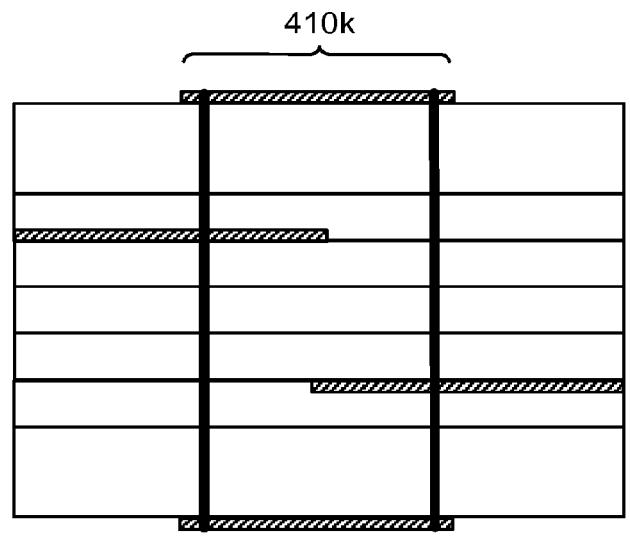
FIG. 16 illustrates one embodiment of a laminate waveguide structure, two probes, and two backshorts.

FIG. 16 illustrates one embodiment of a system for injecting, guiding, and receiving millimeter-waves inside a PCB, similar to the system illustrated by FIG. 15, with the only difference being that the electrically conductive cage 410k does not comprise a cavity. In this case, the electrically conductive cage 410k of the waveguide is formed solely by VIA holes filled or plated with electrically conductive material.

In order to use standard PCB technology in association with millimeter-wave frequencies, special care is required to assure adequate signal transition and propagation among various elements. In one embodiment, a bare-die Integrated Circuit is placed in a specially made cavity within a PCB. The cavity is optionally made as thin as the bare-die Integrated Circuit, such that the upper surface of the bare-die Integrated Circuit levels with an edge of the cavity. This arrangement allows wire-bonding or strip-bonding signal and ground contacts on the bare-die Integrated Circuit with pads located on the edge of the cavity and printed on a lamina of the PCB. The wire or strip used for bonding may be kept very short, because of the tight placement of the bare-die Integrated Circuit side-by-side with the edge of the cavity, and due to the fact that the bare-die Integrated Circuit may level at substantially the same height of the cavity edge. Short bonding wires or strips may facilitate efficient transport of millimeter-wave signals from the bare-die Integrated Circuit to the pads and vice versa. The pads may be part of transmission line formations, such as Micro strip or waveguides, used to propagate signals through the PCB into other components and electrically conductive structures inside and on the PCB.

In one embodiment, a system enabling interface between a millimeter-wave bare-die and a Printed Circuit Board (PCB) includes a cavity of depth equal to X formed in at least one lamina of a PCB. Three electrically conductive pads are printed on one of the laminas of the PCB, the pads substantially reach the edge of the cavity. A bare-die Integrated Circuit or a heightened bare-die Integrated Circuit, optionally having a thickness equal to X, is configured to output a millimeter-wave signal from three electrically conductive contacts arranged in a ground-signal-ground configuration on an upper side edge of the bare-die Integrated Circuit. The bare-die Integrated Circuit is placed inside the cavity optionally such that the electrically conductive pads and the upper side edge containing the electrically conductive contacts are arranged side-by-side at substantially the same height. Three bonding wires or strips electrically connect each electrically conductive contact to one of the electrically conductive pads. In one embodiment, the system transports millimeter-wave signals from the electrically conductive contacts to the electrically conductive pads across the small distance formed between the electrically conductive contacts and the electrically conductive pads.

Figure 17A:
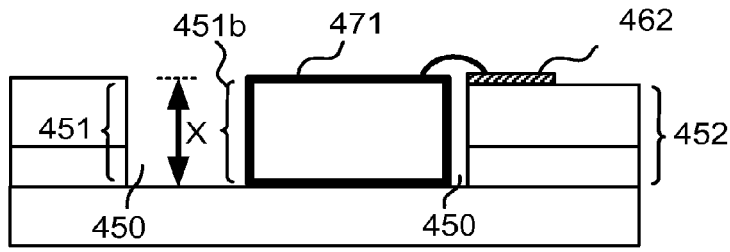
FIG. 17A illustrates a lateral cross-section of a Printed Circuit Board (PCB), a bare-die Integrated Circuit, a bonding wire, and an electrically conductive pad.
Figure 17B:
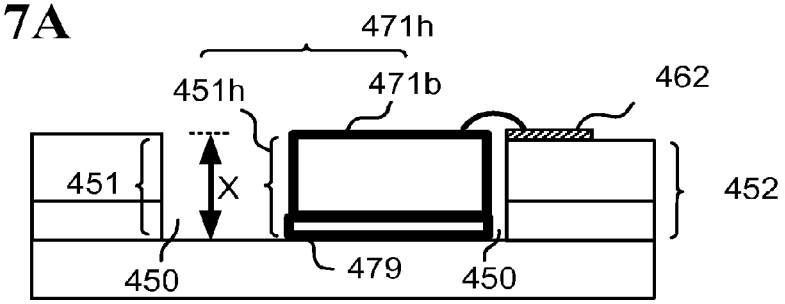
FIG. 17B illustrates a lateral cross-section of a PCB, a heightened bare-die Integrated Circuit, a bonding wire, and a printed pad.
Figure 17C:
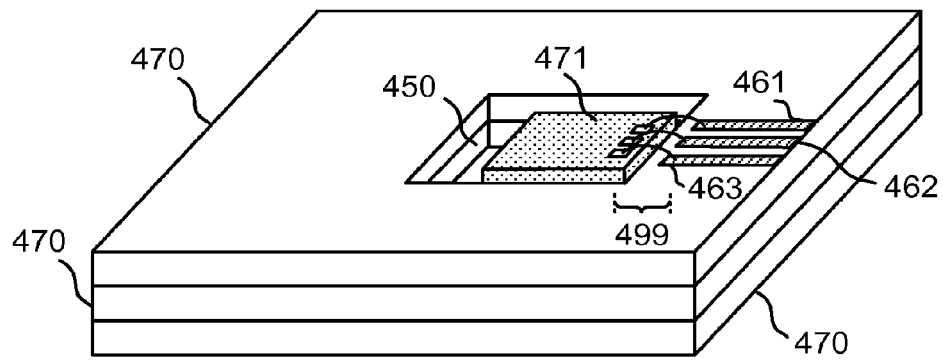
FIG. 17C illustrates one embodiment of a PCB, a bare-die Integrated Circuit, three bonding wire, and three printed pads.
Figure 17D:
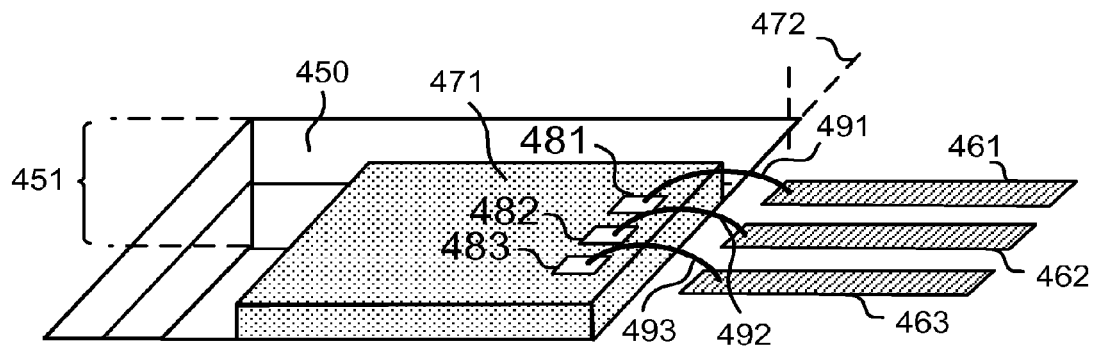
FIG. 17D illustrates one embodiment of a bare-die Integrated Circuit, three bonding wires, and three electrically conductive pads.

FIG. 17A, FIG. 17B, FIG. 17C, and FIG. 17D illustrate one embodiment of a low-loss interface between a millimeter-wave bare-die Integrated Circuit 471 (FIGS. 17A, 17C, 17D) or a heightened bare-die Integrated Circuit 471h (FIG. 17B) and a PCB 470 (FIG. 17C). The heightened bare-die Integrated Circuit 471h (FIG. 17B) may include a bare-die Integrated Circuit 471b (FIG. 17B) mounted on top of a heightening platform 479 (FIG. 17B). The heightening platform 479 (FIG. 17B) may be heat conducting, and may be glued or bonded to the bare-die Integrated Circuit 471b (FIG. 17B). Throughout the specification and claims, a bare-die Integrated Circuit is completely interchangeable with a heightened bare-die Integrated Circuit. A cavity 450 of depth equal to X, is formed in the PCB, in at least one lamina of the PCB illustrated as two laminas 452 (FIGS. 17A, 17B) by way of example. The depth of the cavity 450 is denoted by numeral 451 (FIGS. 17A, 17B, 17D). Other embodiments not illustrated may include a cavity inside a single lamina, the cavity being of depth lesser than the single lamina, or a cavity through multiple laminas ending inside a lamina. Three electrically conductive pads 461, 462, 463 (FIGS. 17C, 17D), are printed on one of the laminas of the Board, such that the electrically conductive pads 461, 462, 463 substantially reach the upper side edge 472 (FIG. 17D) of the cavity 450. The thickness of the bare-die Integrated Circuit 471 is denoted by numeral 451b in FIG. 17A. The thickness of the heightened bare-die Integrated Circuit 471h is denoted by numeral 451h in FIG. 17B. Optionally, the thickness 451b of the bare-die Integrated Circuit 471 or the thickness 451h of the heightened bare-die Integrated Circuit 471h is substantially the same as the depth 451 of the cavity 450. The bare-die Integrated Circuit is configured to transmit and/or receive millimeter-wave signals from three electrically conductive contacts 481, 482, 483 (FIG. 17D) arranged in a ground-signal-ground configuration on an upper side edge of the bare-die Integrated Circuit 471. The bare-die Integrated Circuit 471 is placed inside the cavity 450 such that the electrically conductive pads 461, 462, 463 and the upper side edge 472 are arranged side-by-side at substantially the same height equal to X above the floor of the cavity. Three bonding wires 491, 492, 493 (FIG. 17D) or strips are used to electrically connect each electrically conductive contact 481, 482, 483 to one of the electrically conductive pads 461, 462, 463 respectively. The interface is operative to transport a millimeter-wave signal from the electrically conductive contacts 481, 482, 483 to the electrically conductive pads 461, 462, 463 across a distance 499 (FIG. 17C) which is small and formed between the electrically conductive contacts 481, 482, 483 and the electrically conductive pads 461, 462, 463.

In one embodiment, X is between 100 micron and 300 micron. In one embodiment the distance 499 is smaller than 150 micron. In one embodiment the distance 499 is smaller than 250 micron. In one embodiment the distance 499 is smaller than 350 micron. In one embodiment, at least one additional lamina belonging to the PCB is located above the at least one lamina in which the cavity 450 of depth equal to X is formed. The at least one additional lamina having a second cavity above the cavity of depth equal to X, such that the bare-die Integrated Circuit 471, the bonding wires 491, 492, 493, and the electrically conductive pads 461, 462, 463 are not covered by the at least one additional lamina, and the two cavities form a single cavity space. Optionally, a sealing layer, placed over the second cavity, environmentally seals the bare-die Integrated Circuit 471, the bonding wires 491, 492, 493, and the electrically conductive pads 461, 462, 463, inside the PCB.

In one embodiment, a plurality of Vertical Interconnect Access (VIA) holes, filled with heat conducting material, reach the floor of the cavity 450 and are thermally coupled to the bottom of the bare-die Integrated Circuit or heightening platform. The heat conducting material may both thermally conduct heat away from the bare-die Integrated Circuit into a heat sink coupled to the VIA holes, and maintain a sealed environment inside the cavity. In one embodiment, the heat conducting material is operative to maintain a sealed environment inside the cavity. Conducting epoxy, solder or copper is operative to both maintain a sealed environment inside the cavity, and conduct heat.

Figure 18A:
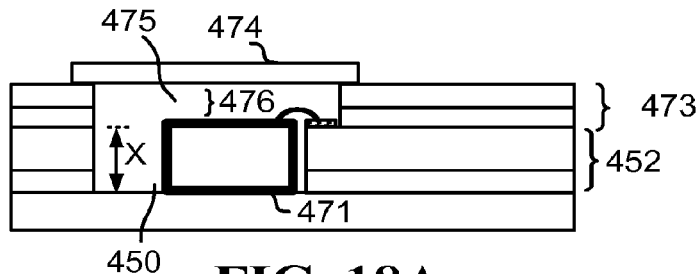
FIG. 18A illustrates a lateral cross-section of a PCB, a bare-die Integrated Circuit, a bonding wire, an electrically conductive pad, and a sealing layer.
Figure 18B:
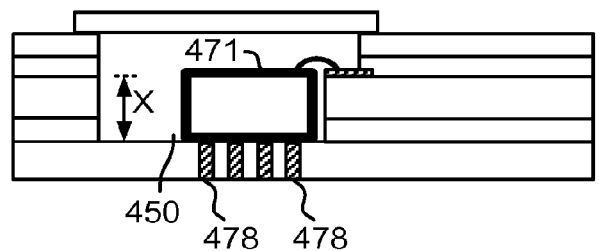
FIG. 18B illustrates a lateral cross-section of a PCB, a bare-die Integrated Circuit, a bonding wire, a an electrically conductive pad, a sealing layer, and Vertical Interconnect Access holes filled with a heat conducting material.

FIG. 18A and FIG. 18B illustrate one embodiment of sealing a bare-die Integrated Circuit 471. At least one additional lamina, illustrated as two additional laminas 473 (FIG. 18A) by way of example, is located above the laminas 452 (FIG. 18A) through which the cavity 450 of depth equal to X is formed. The additional laminas 473 have a second cavity 476 (FIG. 18A) above the cavity 450 of depth equal to X, such that the bare-die Integrated Circuit 471, the bonding wires, and the electrically conductive pads are not covered by additional laminas 473, and the cavity 450 and the second cavity 476 form a single cavity space 475 (FIG. 18A).

In one embodiment, a sealing layer 474 (FIG. 18A) is placed over the second cavity 476, such that the bare-die Integrated Circuit 471, the bonding wires 491, 492, 493 (FIG. 17D), and the electrically conductive pads 461, 462, 463 (FIG. 17D) are environmentally sealed inside the PCB. The sealing layer 474 may be constructed from millimeter-wave absorbing material such as ECCOSORB BSR absorbing material provided by Emerson & Cuming, in order to prevent spurious oscillations. The sealing layer 474 may be attached to the additional laminas 473 using adhesive, or soldered to the additional laminas 473, in order to provide hermetic seal.

Referring to FIG. 18B, in one embodiment, a plurality of Vertical Interconnect Access holes 478, filled with heat conducting material such as epoxy, solder or copper, reach the floor of cavity 450. The heat conductive fill is thermally coupled to the bottom of the bare-die Integrated Circuit 471 or the heightening platform 479 (FIG. 17B). The heat conducting material is optionally operative to both (i) thermally conduct heat away from the bare-die Integrated Circuit 471 into a heat sink coupled to the holes, and (ii) maintain a sealed environment inside the single cavity space 475 (FIG. 18A), protecting a bare-die Integrated Circuit 471 against environmental elements such as humidity and dust.

In one embodiment, a laminate waveguide structure is embedded in the laminas of PCB 470, which is shown in FIG. 17C. A probe is printed on the same lamina as the electrically conductive pad 462 (FIGS. 17A, 17B, 17C, 17D) connected to the electrically conductive contact 482 (FIG. 17D) associated with the signal, and located inside the laminate waveguide structure. A transmission line signal trace is printed as a continuation to the electrically conductive pad 462 connected to the electrically conductive contact 482 associated with the signal, the transmission line signal trace electrically connecting the electrically conductive contact 482 associated with the signal, to the probe.

In one embodiment, the system guides a signal from the bare-die Integrated Circuit 471 (FIGS. 17A, 17C, 17D), through the transmission line signal trace, into the laminate waveguide structure, and outside of the laminate waveguide structure.

In one embodiment, additional laminas 473 (FIG. 18A) belonging to the PCB 470 (FIG. 17C) are located above laminas 452 (FIG. 18A) in which the cavity 450 of depth equal to X is formed. The additional laminas 473 having a second cavity 476 (FIG. 18A) above the cavity 450 of depth equal to X, such that the bare-die Integrated Circuit 471 and the bonding wires 491, 492, 493 (FIG. 17D) are not covered by the additional laminas 473, and the two cavities 450, 476 form a single cavity space 475 (FIG. 18A). The laminate waveguide structure embedded in the laminas of the PCB 470 includes a third cavity optionally having an electrically conductive plating, in at least some of the laminas of the PCB 470, and optionally a first electrically conductive surface printed on one of the additional laminas 473. Optionally, the first electrically conductive surface seals the laminate waveguide structure from one end using an electrically conductive cage comprising VIA holes, in accordance with some embodiments.

In one embodiment, two electrically conductive pads connected to the electrically conductive contacts 481, 483 (FIG. 17D) associated with the ground, are electrically connected, using electrically conductive VIA structures, to a ground layer below the electrically conductive pads, wherein the ground layer together with the transmission line signal trace form a Microstrip transmission line.

In one embodiment, two electrically conductive pads connected to the electrically conductive contacts 481, 483 associated with the ground, are continued as two electrically conductive traces alongside the transmission line signal trace, forming a Co-planar transmission line together with the transmission line signal trace.

Figure 19A:
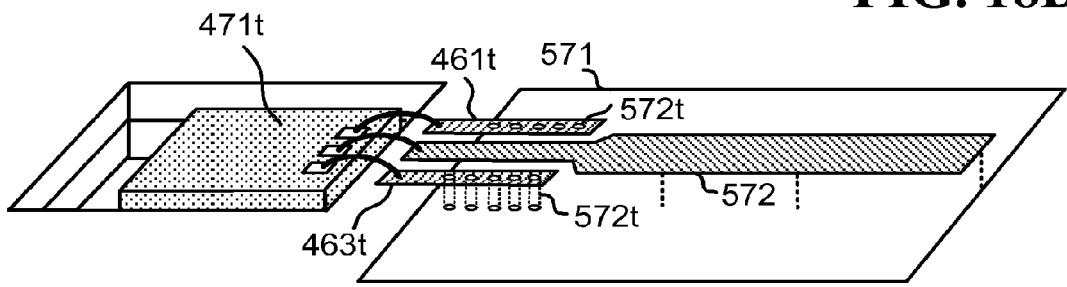
FIG. 19A illustrates one embodiments of a bare die Integrated Circuit, three bonding wires, three electrically conductive pads, and a Microstrip transmission line.
Figure 19B:
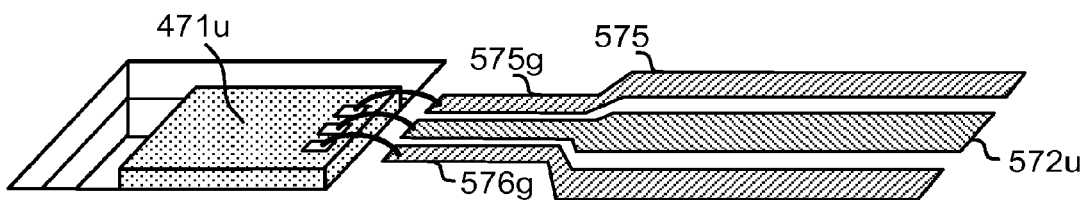
FIG. 19B illustrates one embodiments of a bare die Integrated Circuit, three bonding wires, three electrically conductive pads, and a coplanar transmission line.

FIG. 19A and FIG. 19B illustrate two embodiments of a bare-die Integrated Circuit 471t (FIG. 19A), 471u (FIG. 19B), similar to bare-die Integrated Circuit 471 (FIGS. 17A, 17C, 17D), electrically connected to a transmission line signal trace 572 (FIG. 19A), 572u (FIG. 19B). Referring to FIG. 19A, in one embodiment, the electrically conductive pads 461t, 463t configured as ground are connected, using electrically conductive VIA structures 572t, to a ground layer 571 printed under the transmission line signal trace 572. The ground layer 571 together with the transmission line signal trace 572 form a Microstrip transmission line. Referring to FIG. 19B, in one embodiment, electrically conductive pads 575g, 576g configured as ground are continued as two electrically conductive traces 575, 576 alongside the transmission line signal trace 572u, forming a Co-planar transmission line together with the transmission line signal trace 572u.

In one embodiment, the same lamina used to carry the probe and transmission line signal trace 572 (FIG. 19A) on one side, is the lamina used to carry the ground layer 571 (FIG. 19A) on the opposite side, and is made out of a soft laminate material suitable to be used as a millimeter-wave band substrate in PCB, such as Rogers® 4350B laminate material, Arlon CLTE-XT laminate material, or Arlon AD255A laminate material.

Figure 20:
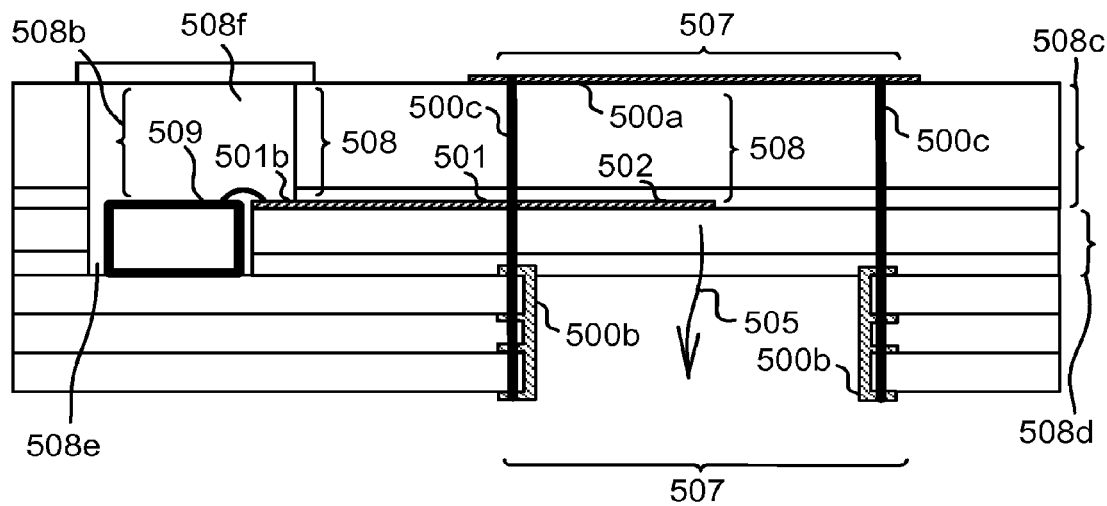
FIG. 20 illustrates a lateral cross-section of a laminate structure, a bare-die Integrated Circuit, bonding wire, electrically conductive pad, a transmission line signal trace, a probe, a sealing layer, a backshort, Vertical Interconnect Access holes forming an electrically conductive cage, and a laminate waveguide structure.

FIG. 20 illustrates one embodiment of a bare-die Integrated Circuit electrically connected to a transmission line reaching a printed probe inside a laminate waveguide structure. A transmission line 501 electrically connects an electrically conductive pad 501b to a probe 502; wherein the electrically conductive pad 501b is associated with an electrically conductive contact through which a millimeter-wave signal is received or transmitted, such as electrically conductive contact 482 belonging to a bare-die Integrated Circuit such as bare-die Integrated Circuit 471 as shown in FIG. 17D. A probe 502 is located inside a laminate waveguide structure 507 embedded within a PCB, in accordance with some embodiments. A millimeter-wave signal generated by bare-die Integrated Circuit 509 similar to bare-die Integrated Circuit 471 is injected into the transmission line 501 via bonding wires, propagates up to the probe 502, radiated by the probe 502 inside the laminate waveguide structure 507 as a millimeter-wave 505, and is then guided by the laminate waveguide structure 507 out of the PCB. The millimeter-wave signal path may be bi-directional, and optionally allows millimeter-wave signals to be picked-up by the bare-die Integrated Circuit 509. The bare-die Integrated Circuit 509 is placed in a cavity formed in the PCB, in accordance with some embodiments. The depth 508 of a second cavity 508b formed above the cavity in which the bare-die Integrated Circuit 509 is placed, can be designed such as to form a desired distance between the probe 502 and a first electrically conductive surface 500a used to electromagnetically seal the laminate waveguide formation 507 at one end.

In one embodiment, at least one additional lamina illustrated as two additional laminas 508c by way of example, belonging to the PCB, is located above laminas 508d in which cavity 508e of depth equal to X is formed. The additional laminas 508c having a second cavity 508b above cavity 508e, such that the bare-die Integrated Circuit 509 and the bonding wires are not covered by the additional laminas 508c, and the two cavities 508e, 508b form a single cavity space 508f, in accordance with some embodiments. The laminate waveguide structure 507 embedded in the laminas of the PCB includes a third cavity 508f optionally having an electrically conductive plating 500b, in at least some of the laminas of the PCB, and optionally a first electrically conductive surface 500a printed on one of the additional laminas 508c. Optionally, the first electrically conductive surface 500a seals the laminate waveguide structure 507 from one end using an electrically conductive cage comprising VIA holes 500c, in accordance with some embodiments.

In one embodiment, the aperture of the laminate waveguide structure 507 is dimensioned to result in a laminate waveguide structure 507 having a cutoff frequency above 20 GHz. In one embodiment, the aperture of laminate waveguide structure 507 is dimensioned to result in a laminate waveguide structure 507 having a cutoff frequency above 50 GHz. In one embodiment, the aperture of laminate waveguide structure 507 is dimensioned to result in a laminate waveguide structure 507 having a cutoff frequency above 57 GHz.

Figure 22:
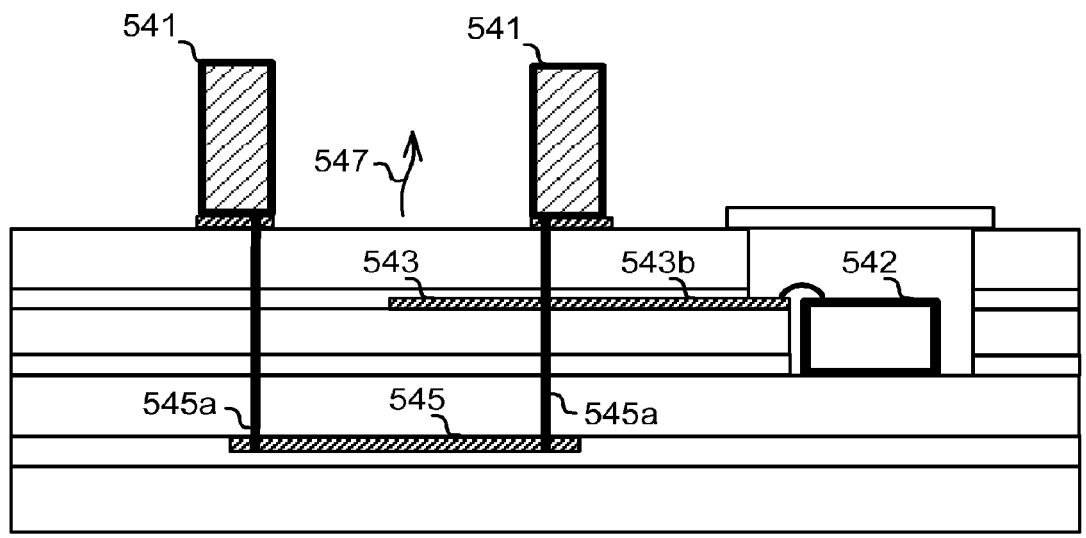
FIG. 22 illustrates a lateral cross-section of a laminate structure, a bare-die Integrated Circuit, electrically conductive pad, a transmission line signal trace, a probe, a sealing layer, a backshort, Vertical Interconnect Access holes forming an electrically conductive cage, and a discrete waveguide.

FIG. 22 illustrates one embodiment of a bare-die Integrated Circuit IC, electrically connected to a transmission line signal trace ending with a probe located inside an electrically conductive cage configured to seal one end of a discrete waveguide, in accordance with some embodiments. A bare-die Integrated Circuit 542 is placed inside a cavity in a PCB, and is connected with a transmission line signal trace 543*b* using bonding wire or strip, in accordance with some embodiments. A discrete waveguide 541 is attached to the PCB. A probe 543 is printed at one end of the transmission line signal trace 543*b*, and located below the aperture of the discrete waveguide 541. A first electrically conductive surface 545 is printed on a lamina located below the probe 543, sealing the discrete waveguide from one end using an electrically conductive cage comprising VIA holes 545*a* filled with electrically conductive material, in accordance with some embodiments. Optionally, a millimeter-wave signal is transported by the transmission line signal trace 543*b* from the bare-die Integrated Circuit 542 to the probe 543, and is radiated as millimeter-waves 547 through the discrete waveguide 541.

In one embodiment, a probe is printed in continuation to the electrically conductive pad 462 (FIGS. 17C, 17D) connected to the electrically conductive contact 482 (FIG. 17D) associated with the signal. A discrete waveguide is attached to the PCB 470 (FIG. 17C), such that the bare-die Integrated Circuit 471 (FIGS. 17C, 17D) and the probe are located below the aperture of the discrete waveguide. In one embodiment, the system is configured to guide a signal from the bare-die Integrated Circuit 471, through the probe, into the discrete waveguide, and outside of the discrete waveguide.

In one embodiment, a first electrically conductive surface printed on a lamina located below the probe and bare-bare-die Integrated Circuit 471 (FIGS. 17C, 17D), seal the discrete waveguide from one end using an electrically conductive cage comprising VIA holes, such that the probe and bare-bare-die Integrated Circuit 471 are located inside the electrically conductive cage.

Figure 23:
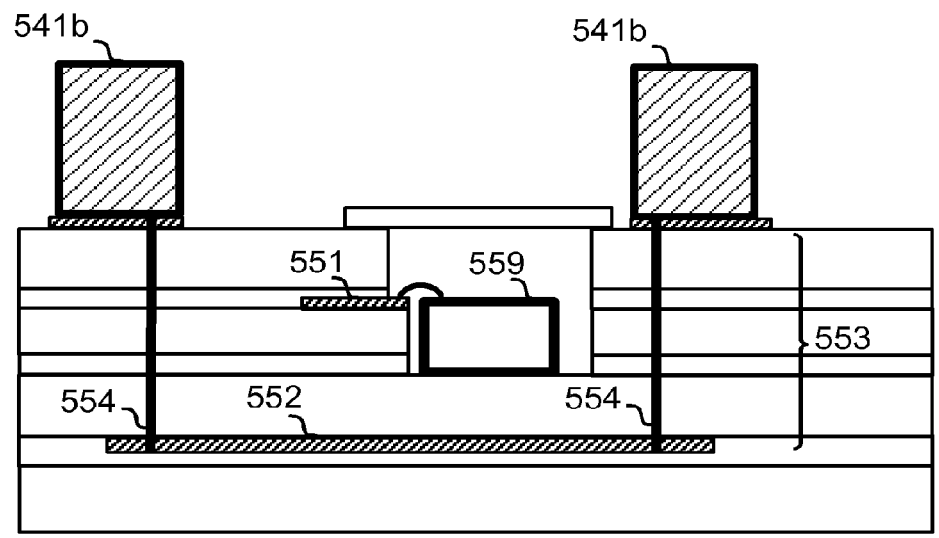
FIG. 23 illustrates a lateral cross-section of a laminate structure, a bare-die Integrated Circuit, electrically conductive pad, a probe, a sealing layer, a backshort, Vertical Interconnect Access holes forming an electrically conductive cage, and a discrete waveguide.

FIG. 23 illustrates one embodiment of a bare-die Integrated Circuit 559, electrically connected to a probe 551, both located inside an electrically conductive cage 553 that seals one end of a discrete waveguide 541*b*. The bare-die Integrated Circuit 559 is placed inside a cavity in a PCB, and is connected with the probe 551 using a bonding wire or strip, in accordance with some embodiments. The discrete waveguide 541*b* is attached to the PCB. The probe 551 is located below the aperture of the discrete waveguide 541*b*. A first electrically conductive surface 552 is printed on a lamina located below the probe 551, sealing the discrete waveguide 541*b* from one end using an electrically conductive cage 553 comprising VIA holes 554 filled with electrically conductive material, in accordance with some embodiments. Both the bare-die Integrated Circuit 559 and the probe 551 are located inside the electrically conductive cage 553. Optionally, a millimeter-wave signal is delivered to the probe 551 directly from the bare-die Integrated Circuit 559, and is radiated from there through the discrete waveguide.

In one embodiment, a system for interfacing between a millimeter-wave flip-chip and a laminate waveguide structure embedded inside a Printed Circuit Board (PCB) includes a cavity formed in a PCB, going through at least one lamina of the PCB. An electrically conductive pad printed inside the cavity is printed on a lamina under the cavity, wherein the lamina under the cavity forms a floor to the cavity. A flip-chip Integrated Circuit or a Solder-Bumped die is configured to output a millimeter-wave signal from a bump electrically connected with the electrically conductive pad. A laminate waveguide structure is embedded in laminas of the PCB, comprising a first electrically conductive surface printed on a lamina of the PCB above the floor of the cavity. A probe is optionally printed on the same lamina as the electrically conductive pad, and is located inside the laminate waveguide structure and under the first electrically conductive surface. A transmission line signal trace is printed as a continuation to the electrically conductive pad, the transmission line electrically connecting the bump associated with the signal to the probe.

In one embodiment, the system guides a signal from the flip-chip or Solder-Bumped die, through the transmission line signal trace, into the laminate waveguide structure, and outside of the laminate waveguide structure. In one embodiment, the laminate waveguide structure embedded in the laminas of the PCB includes a second cavity, plated with electrically conductive plating, in at least some of the laminas of the PCB, and the first electrically conductive surface printed above the second cavity seals the laminate waveguide structure from one end using an electrically conductive cage comprising VIA holes.

Figure 21:
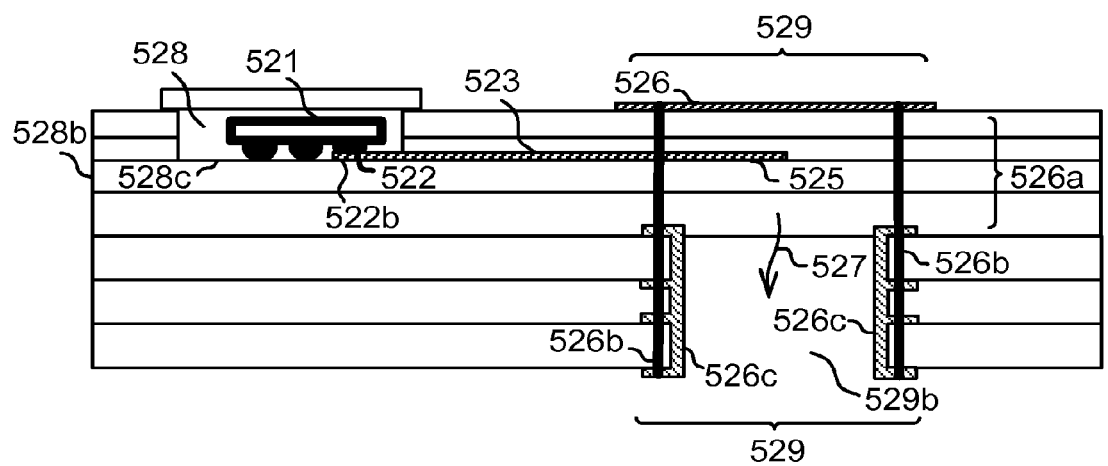
FIG. 21 illustrates a lateral cross-section of a laminate structure, a flip chip, electrically conductive pad, a transmission line signal trace, a probe, a sealing layer, a backshort, Vertical Interconnect Access holes forming an electrically conductive cage, and a laminate waveguide structure.

FIG. 21 illustrates one embodiment of a flip-chip Integrated Circuit, or Solder-Bumped die 521, electrically connected to a transmission line signal trace 523 reaching a probe 525 inside a laminate waveguide structure 529. A cavity 528 is formed in a PCB, going through at least one lamina of the PCB. An electrically conductive pad 522*b* is printed on a lamina 528*b* comprising the floor of the cavity 528*c*. A flip-chip Integrated Circuit, or Solder-Bumped die, 521, placed inside cavity 528, is configured to output a millimeter-wave signal from a bump 522 electrically connected to the electrically conductive pad 522*b*. The laminate waveguide structure 529, in accordance with some embodiments, is embedded in the PCB. The probe 525 is printed on the same lamina 528*b* as the electrically conductive pad 522*b*, and located inside the laminate waveguide structure 529, under a first electrically conductive surface 526 printed above lamina 528*b*. A transmission line signal trace 523, printed as a continuation to the electrically conductive pad 522*b*, is electrically connecting the bump to the probe 525. The system is configured to guide a signal from the flip-chip Integrated Circuit, 521 through the transmission line signal trace 523, into the laminate waveguide structure 529, and outside of the laminate waveguide structure 529 in the form of millimeter-waves 527. The depth of the cavity 528 can be designed such as to form a desired distance between the probe 525 and a first electrically conducive surface 526 used to electromagnetically seal the laminate waveguide structure at one end. In one embodiment, the flip-chip Integrated Circuit, or Solder-Bumped die, is sealed inside the cavity 528, in accordance with some embodiments.

In one embodiment, the laminate waveguide structure 529 embedded in the laminas of the PCB includes a second cavity 529*b*, plated with electrically conductive plating 526*c*, in at least some of the laminas of the PCB, and the first electrically conductive surface 526 printed above the second cavity 529*b* seals the laminate waveguide structure 529 from one end using an electrically conductive cage 526*a* comprising VIA holes 526*b*.

In one embodiment, a system enabling interface between a millimeter-wave bare-die Integrated Circuit and a Printed Circuit Board (PCB) includes a cavity of depth equal to X formed in at least one lamina of a PCB. Two electrically conductive pads are printed on one of the laminas of the PCB, the electrically conductive pads reach the edge of the cavity. A bare-die Integrated Circuit of thickness equal to X, or a heightened bare-die Integrated Circuit of thickness equal to X, is configured to output a millimeter-wave signal from two electrically conductive contacts arranged in differential signal configuration on an upper side edge of the bare-die Integrated Circuit; the bare-die Integrated Circuit is placed inside the cavity such that the electrically conductive pads and the upper side edge containing the electrically conductive contacts are arranged side-by-side at substantially the same height. Two bonding wires or strips electrically connect each electrically conductive contact to a corresponding electrically conductive pad.

In one embodiment, the system transports millimeter-wave signals from the electrically conductive contacts to the electrically conductive pads across the small distance formed between the electrically conductive contacts and the electrically conductive pads.

In one embodiment, a laminate waveguide structure is embedded in the laminas of the PCB. A probe is printed on the same lamina as the electrically conductive pads, and located inside the laminate waveguide structure. A co-planar or slot-line transmission line printed as a continuation to the electrically conductive pads, the co-planar or slot-line transmission line electrically connecting the electrically conductive pads to the probe.

In one embodiment, the system guides a signal from the bare-die Integrated Circuit, through the co-planar or slot-line transmission line, into the laminate waveguide structure, and outside of the laminate waveguide structure.

In one embodiment, a discrete waveguide is attached to the PCB. A probe is printed on the same lamina as the electrically conductive pads, and located below the aperture of the discrete waveguide. A co-planar or slot-line transmission line is printed as a continuation to the electrically conductive pads, the co-planar or slot-line transmission line electrically connecting the electrically conductive pads to the probe.

In one embodiment, the system guides a signal from the bare-die Integrated Circuit, through the co-planar or slot-line transmission line, into the discrete waveguide, and outside of the discrete waveguide.

Figure 19C:
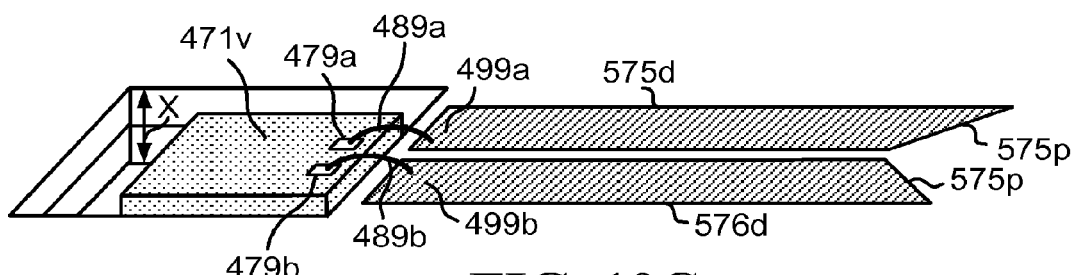
FIG. 19C illustrates one embodiments of a bare die Integrated Circuit, two bonding wires, two electrically conductive pads extended into a coplanar or a slot-line transmission line, and a probe.

FIG. 19C illustrates one embodiments of a bare-die Integrated Circuit 471v or a heightened bare-die Integrated Circuit electrically connected to a co-planar or slot-line transmission line 575d, 576d. The bare-die Integrated Circuit 471v of thickness equal to X is placed in a cavity of depth equal to X, in accordance with some embodiments. Two bonding wires 489a, 489b are used to electrically connect electrically conductive contacts 479a, 479b, arranged in differential signal configuration on the bare-die Integrated Circuit, to two electrically conductive pads 499a, 499b, extending into the co-planar or slot-line transmission line 575d, 576d transmission line. In one embodiment, the transmission line reaches a probe 575p. In one embodiment, the probe is located either above a laminate waveguide structure formed within the PCB, or below a discrete waveguide attached to the PCB, in accordance with some embodiments.

In one embodiment, a bare-die Integrated Circuit implemented in SiGe (silicon-germanium) or CMOS, typically has electrically conductive contacts placed on the top side of the bare-die Integrated Circuit. The electrically conductive contacts are optionally arranged in a tight pitch configuration, resulting in small distances between one electrically conductive contact center point to a neighboring electrically conductive contact center point. According to one example, a 150 micron pitch is used. The electrically conductive contacts are connected with electrically conductive pads on the PCB via bonding wires or strips. The bonding wires or strips have a characteristic impedance typically higher than the impedance of the bare-die Integrated Circuit used to drive or load the bonding wires. According to one example, the bonding wires have a characteristic impedance between 75 and 160 ohm, and a single ended bare-die Integrated Circuit has an impedance of 50 ohm used to drive or load the bonding wires. In one embodiment, a narrow transmission line signal trace printed on the PCB is used to transport a millimeter-wave signal away from the electrically conductive pads. In one embodiment, the narrow transmission line signal trace is narrow enough to fit between two electrically conductive pads of ground, closely placed alongside corresponding electrically conductive contacts of ground on the bare-die Integrated Circuit. According to one example, the thin transmission line signal trace has a width of 75 microns, which allows a clearance of about 75 microns to each direction where electrically conductive pads of ground are found, assuming a ground-signal-ground configuration at an electrically conductive contact pitch (and corresponding electrically conductive pad pitch) of 150 microns. In one embodiment, the thin transmission line signal trace results in a characteristic impedance higher than the impedance of the bare-die Integrated Circuit used to drive or load the bonding wires, and typically in the range of 75-160 ohm. In one embodiment, a long-enough thin transmission line signal trace, together with the bonding wires or strips, creates an impedance match for the bare-die Integrated Circuit impedance used to drive or load the bonding wires. In this case, the length of the thin transmission line signal trace is calculated to result in said match. In one embodiment, after a certain length, the thin transmission line signal trace widens to a standard transmission line width, having standard characteristic impedance similar to the bare-die Integrated Circuit impedance used to drive or load the bonding wires, and typically 50 ohm.

In one embodiment, a system for matching impedances of a bare-die Integrated Circuit and bonding wires includes a bare-die Integrated Circuit or a heightened bare-die Integrated Circuit configured to output or input, at an impedance of Z3, a millimeter-wave signal from three electrically conductive contacts arranged in a ground-signal-ground configuration on an upper side edge of the bare-die Integrated Circuit. Optionally, the spacing between the center point of the electrically conductive contact associated with the signal to each of the center points of the electrically conductive contact associated with the ground is between 100 and 250 microns. Three electrically conductive pads are printed on one of the laminas of a Printed Circuit Board (PCB), arranged in a ground-signal-ground configuration alongside the upper side edge of the bare-die Integrated Circuit, and connected to the three electrically conductive contacts via three bonding wires respectively, the bonding wires have a characteristic impedance of Z1, wherein Z1>Z3. The electrically conductive pad associated with the signal extends to form a transmission line signal trace of length L, the transmission line signal trace has a first width resulting in characteristic impedance of Z2, wherein Z2>Z3. Optionally, the transmission line signal trace widens to a second width, higher than the first width, after the length of L, operative to decrease the characteristic impedance of the transmission line signal trace to substantially Z3 after the length L and onwards, where Z3 is at most 70% of Z2 and Z3 is at most 70% of Z1. In one embodiment, the system is configured to match an impedance seen by the bare-die Integrated Circuit at the electrically conductive contacts with the impedance Z3, by determining L.

Figure 24A:
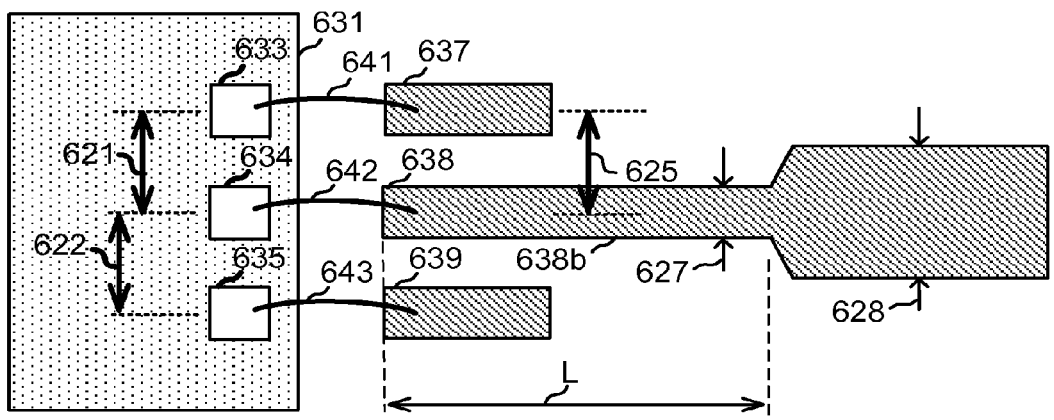
FIG. 24A illustrates a top view of a bare-die Integrated Circuit, three bonding wires, three electrically conductive pads, and transmission line signal trace.

FIG. 24A illustrates one embodiment of a system configured to match driving or loading impedances of a bare-die Integrated Circuit and bonding wires. A bare-die Integrated Circuit 631 is configured to output or input at an impedance of Z3, a millimeter-wave signal from three electrically conductive contacts 633, 634, 635 arranged in a ground-signal-ground configuration on an upper side edge of the bare-die Integrated Circuit. The spacings 621, 622 between the center point of the electrically conductive contact 634 to each of the center points of the electrically conductive contacts 633, 635 is between 100 and 250 microns. Spacing 625 between the center points of electrically conductive pads 637, 638 may be similar in value to spacing 621. Three electrically conductive pads 637, 638, 639 are printed on one of the laminas of a PCB. The electrically conductive pads are arranged in a ground-signal-ground configuration alongside the electrically conductive contacts 633, 634, 635, or in proximity to the electrically conductive contacts. The electrically conductive pads 637, 638, 639 are connected to the three electrically conductive contacts 633, 634, 635 via three short bonding wires 641, 642, 643 respectively. The bonding wires 641, 642, 643 have a characteristic impedance of Z1>Z3. Electrically conductive pad 638 extends to form a transmission line signal trace 638b of length L, while the width of the transmission line signal trace, denoted by numeral 627, is designed to result in a characteristic impedance of Z2, wherein Z2>Z3. The transmission line signal trace widens, to a new width denoted by numeral 628, after the length of L. The transmission line signal trace has a characteristic impedance of substantially Z3 after the length L and onwards. In one embodiment, Z3 is at most 70% of Z2 and Z3 is at most 70% of Z1. Optionally, the system matches an impedance seen by the bare-die Integrated Circuit at the electrically conductive contacts with the impedance Z3, by determining L. There exists at least one value of L, for which the system matches an impedance seen by the bare-die Integrated Circuit at the electrically conductive contacts with the impedance Z3, by determining L, therefore, optionally, allowing for a maximal power transfer between the bare-die Integrated Circuit and the bonding wires. In one embodiment, the length L is determined such that the cumulative electrical length, up to the point where the transmission line signal trace 638b widens, is substantially one half the wavelength of the millimeter-wave signal transmitted via the electrically conductive contact 634 associated with the signal.

In one embodiment, a cavity of depth equal to X is formed in the PCB, going through at least one lamina of the PCB, wherein the three electrically conductive pads 637, 638, 639 are printed on one of the laminas of the PCB, and the electrically conductive pads 637, 638, 639 substantially reach the edge of the cavity. The bare-die Integrated Circuit or the heightened bare-die Integrated Circuit 631 is of thickness equal to X, and the bare-die Integrated Circuit or the heightened bare-die Integrated Circuit 631 is placed inside the cavity such that the electrically conductive pads 637, 638, 639 and the electrically conductive contacts 633, 634, 635 are arranged side-by-side at substantially the same height, in accordance with some embodiments. Optionally, the system transports millimeter-wave signals between the electrically conductive contacts 633, 634, 635 and the electrically conductive pads 637, 638, 639 across a small distance of less than 500 microns, formed between each electrically conductive contact 633, 634, 635 and corresponding electrically conductive pad 637, 638, 639.

In one embodiment, the two electrically conductive pads 637, 639 connected to the electrically conductive contacts 633, 635 associated with the ground are electrically connected, through Vertical Interconnect Access holes, to a ground layer below the electrically conductive pads 637, 639, wherein the ground layer together with the transmission line signal trace 638b form a Micro strip transmission line, in accordance with some embodiments.

In one embodiment, the two electrically conductive pads 637, 639 connected to the electrically conductive contacts 633, 635 associated with the ground are electrically connected, using capacitive pad extensions, to a ground layer below the electrically conductive pads 637, 639, wherein the ground layer together with the transmission line signal trace form a Microstrip transmission line. Optionally, the capacitive pad extensions are radial stubs.

In one embodiment, the same lamina used to carry transmission line signal trace 638b and electrically conductive pads 637, 638, 639 on one side, is the lamina used to carry the ground layer on the opposite side, and the lamina used to carry transmission line signal trace 638b is made out of a soft laminate material suitable to be used as a millimeter-wave band substrate in PCB, such as Rogers® 4350B laminate material, Arlon CLTE-XT laminate material, or Arlon AD255A laminate material.

In one embodiment, Z1 is between 75 and 160 ohm, Z2 is between 75 and 160 ohm, and Z3 is substantially 50 ohm. In one embodiment, the spacings 621, 622 between the center point of electrically conductive contact 634 associated with the signal to each of the center points of electrically conductive contacts 633, 635 associated with the grounds, is substantially 150 microns, the width 627 of transmission line signal trace 638b up to length L is between 65 and 85 microns, and the spacing between the transmission line signal trace 638b and each of electrically conductive pads 637, 639 associated with the ground is between 65 and 85 microns.

In one embodiment, a transmission line signal trace 638b has a characteristic impedance Z2 between 75 and 160 ohm and length L between 0.5 and 2 millimeters, is used to compensate a mismatch introduced by bonding wires 641, 642, 643 that have a characteristic impedance Z1 between 75 and 160 ohm and a length between 200 and 500 microns.

Figure 24B:
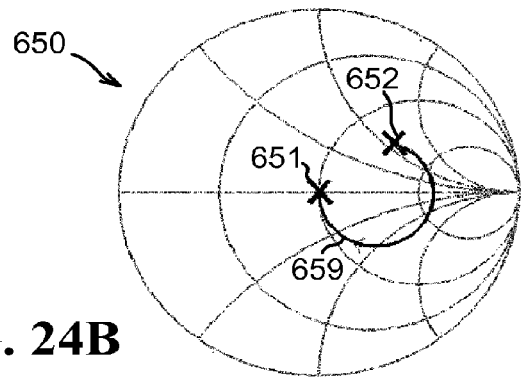
FIG. 24B illustrates one embodiment of using a Smith chart.

FIG. 24B illustrates one embodiment of using a Smith chart 650 to determine the length L. Location 651, illustrated as a first X on the Smith chart represents impedance Z3, at which the bare-die Integrated Circuit inputs or outputs millimeter-wave signals. Location 652, illustrated as a second X on the Smith chart represents a first shift in load seen by the bare-die Integrated Circuit, as a result of introducing the bonding wires 641, 642, 643 in FIG. 24A. Path 659, connecting location 652 back to location 651 in a clockwise motion, represents a second shift in load seen by the bare-die Integrated Circuit, as a result of introducing the transmission line signal trace of length L. In one embodiment, L is defined as the length of a transmission line signal trace needed to create the Smith chart motion from location 652 back to location 651, which represents a match to impedance Z3, and cancellation of a mismatch introduced by the bonding wires. In one embodiment, location 651 represents 50 ohm.

In one embodiment, the system is operative to transport the millimeter-wave signal belonging to a frequency band between 20 GHz and 100 GHz, from electrically conductive contact 634 associated with the signal to the transmission line signal trace 638b. In one embodiment, a capacitive thickening along the transmission line signal trace 638b, and before the transmission line signal trace 638b widens, is added in order to reduce the length L needed to match the impedance seen by the bare-die Integrated Circuit 631 at the electrically conductive contacts 633, 634, 635 with the impedance Z3.

Figure 25:
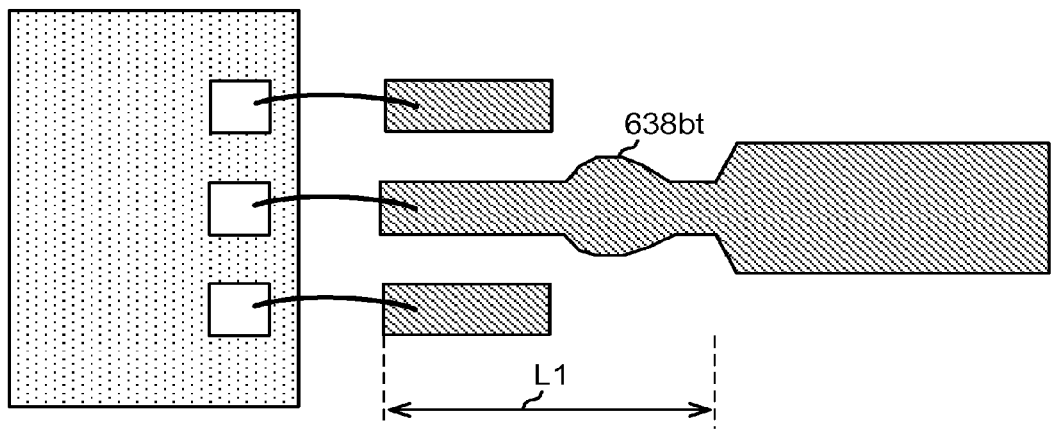
FIG. 25 illustrates a top view of a bare-die Integrated Circuit, three bonding wires, three electrically conductive pads, and transmission line signal trace comprising a capacitive thickening.

FIG. 25 illustrates one embodiment of a system configured to match driving or loading impedances of a bare-die Integrated Circuit and bonding wires, in accordance with some embodiments, with the exception that a capacitive thickening 638bt of the transmission line signal trace is added, in order to reduce the length L (FIG. 24A), needed to match an impedance, seen by a bare-die Integrated Circuit at electrically conductive contacts of the bare-die Integrated Circuit, with the impedance Z3 in accordance with some embodiments. All things otherwise equal, the length L1 (FIG. 25) is shorter than the length L of FIG. 24A, because of the capacitive thickening 638bt.

In one embodiment, a system configured to match impedances of a bare-die Integrated Circuit and bonding wires includes a bare-die Integrated Circuit or a heightened bare-die Integrated Circuit configured to output or input, at an impedance Z3, a millimeter-wave signal from two electrically conductive contacts arranged in a side-by-side differential signal configuration on an upper side edge of the bare-die Integrated Circuit. Two electrically conductive pads, printed on one of the laminas of a Printed Circuit Board (PCB), are arranged alongside the upper side edge of the bare-die Integrated Circuit, and connected to the two electrically conductive contacts via two bonding wires respectively, the wires have a characteristic impedance of Z1, wherein Z1>Z3. The two electrically conductive pads extend to form a slot-line transmission line of length L, having a characteristic impedance of Z2, wherein Z2>Z3. Optionally, the slot-line transmission line is configured to interface with a second transmission line having a characteristic impedance seen by the slot-line transmission line as substantially Z3. In one embodiment, the system is configured to match an impedance seen by the bare-die Integrated Circuit at the electrically conductive contacts with the impedance Z3, by determining L.

In one embodiment, a cavity of depth equal to X is formed in the PCB, going through at least one lamina of the PCB. The two electrically conductive pads are printed on one of the laminas of the PCB, the electrically conductive pads substantially reach the edge of the cavity. The bare-die Integrated Circuit or the heightened bare-die Integrated Circuit is optionally of thickness equal to X, and the bare-die Integrated Circuit is placed inside the cavity such that the electrically conductive pads and the upper side edge that contains the electrically conductive contacts are arranged side-by-side at substantially the same height.

In one embodiment, the system is configured to transport millimeter-wave signals from the electrically conductive contacts to the electrically conductive pads across a small distance of less than 500 microns, formed between each electrically conductive contact and corresponding electrically conductive pad. In one embodiment, the lamina used to carry the slot-line transmission line is made out of a soft laminate material suitable to be used as a millimeter-wave band substrate in PCB, such as Rogers® 4350B laminate material, Rogers RT6010 laminate material, Arlon CLTE-XT laminate material, or Arlon AD255A laminate material. In one embodiment, the system transports millimeter-wave signals belonging to a frequency band between 20 GHz and 100 GHz, from the electrically conductive contacts to the slot-line transmission line. In one embodiment, Z1 is between 120 and 260 ohm, Z2 is between 120 and 260 ohm, and Z3 is substantially two times 50 ohm. In one embodiment, the length L is determined such that the cumulative electrical length, up to the end of the slot-line transmission line, is substantially one half the wavelength of the millimeter-wave signal transmitted via the electrically conductive contacts. In one embodiment, the second transmission line is a Microstrip, and the interface comprises balanced-to-unbalanced signal conversion. In one embodiment, Z1 is between 120 and 260 ohm, Z2 is between 120 and 260 ohm, Z3 is substantially two times 50 ohm, and the Microstrip has a characteristic impedance of substantially 50 ohm.

Figure 26:
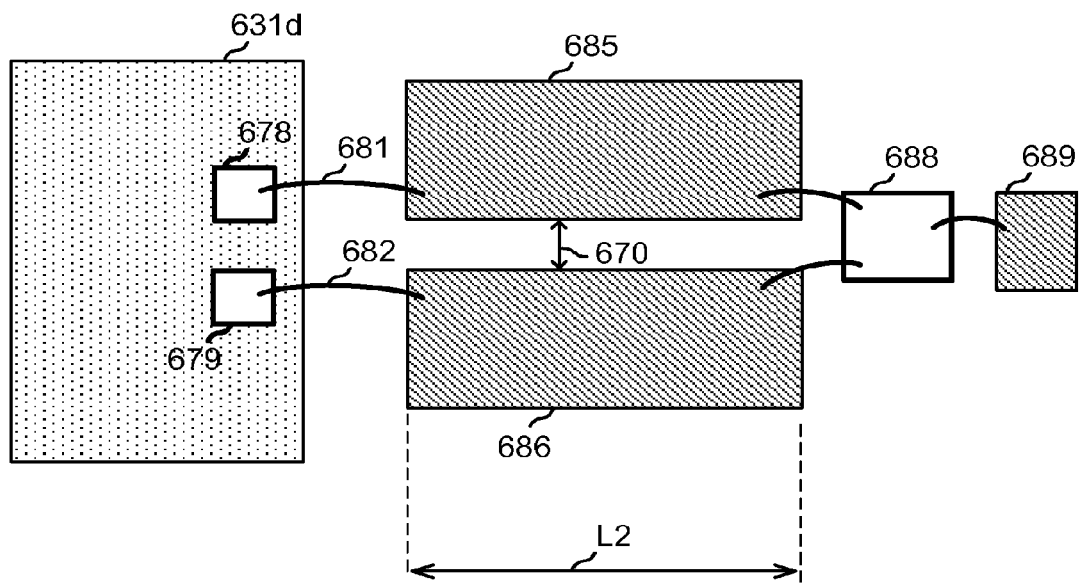
FIG. 26 illustrates a top view of a bare-die Integrated Circuit, two bonding wires, two electrically conductive pads, one slot-line transmission line, one balanced-to-unbalanced signal converter, and a transmission line.

FIG. 26 illustrates one embodiment of a system configured to match impedances of a bare-die Integrated Circuit and bonding wires. A bare-die Integrated Circuit 631d is configured to output or input at a differential port impedance Z3, a millimeter-wave signal from two electrically conductive contacts 678, 679 arranged in a side-by-side differential signal port configuration on an upper side edge of the bare-die Integrated Circuit 631d. Two electrically conductive pads 685, 686 are printed on one of the laminas of a PCB. The electrically conductive pads 685, 686 are arranged alongside the electrically conductive contacts 678, 679, or in proximity to the electrically conductive contacts, and connected to the two electrically conductive contacts via two bonding wires 681, 682 respectively. The bonding wires have a characteristic impedance of Z1, wherein Z1>Z3. The two electrically conductive pads 685, 686 have a constant gap 670 separating them, thereby extending to form a slot-line transmission line of length L2. The slot-line transmission line 685, 686 has a characteristic impedance of Z2, wherein Z2>Z3. The slot-line transmission line 685, 686 is configured to interface with a second transmission line 689, having a characteristic impedance seen by the slot-line transmission line 685, 686 as substantially Z3, via a differential to single-ended conversion element 688. The system is configured to match an impedance seen by the bare-die Integrated Circuit 631d at the electrically conductive contacts 678, 679 with the impedance Z3, by determining L2.

In one embodiment, a PCB comprising a waveguide embedded within a laminate structure of the PCB, in accordance with some embodiments, is constructed by first creating a pressed laminate structure comprising a cavity belonging to a waveguide. The pressed laminate structure is then pressed again together with additional laminas to form a PCB. The additional laminas comprise additional elements such as a probe printed and positioned above the cavity, and/or a bare-die Integrated Circuit placed in a second cavity within the additional laminas.

In one embodiment, a method for constructing millimeter-wave laminate structures using Printed Circuit Board (PCB) processes includes the following steps: Creating a first pressed laminate structure comprising at least two laminas and a cavity, the cavity is shaped as an aperture of a waveguide, and goes perpendicularly through all laminas of the laminate structure. Plating the cavity with electrically conductive plating, using a PCB plating process. Pressing the first pressed laminate structure together with at least two additional laminas comprising a probe printed on one of the at least two additional laminas, into a PCB comprising the first pressed laminate structure and the additional laminas, such that the cavity is sealed only from one end by the additional laminas and the probe, and the probe is positioned above the cavity.

Figure 27A:
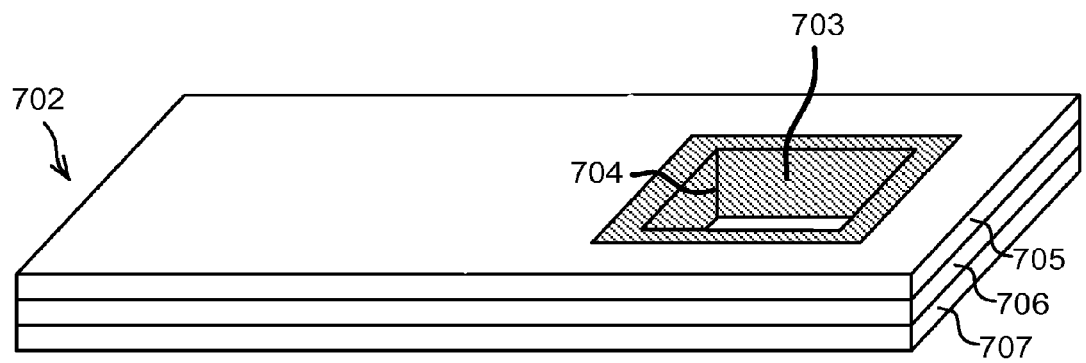
FIG. 27A illustrates one embodiment of a laminate waveguide structure.
Figure 27B:
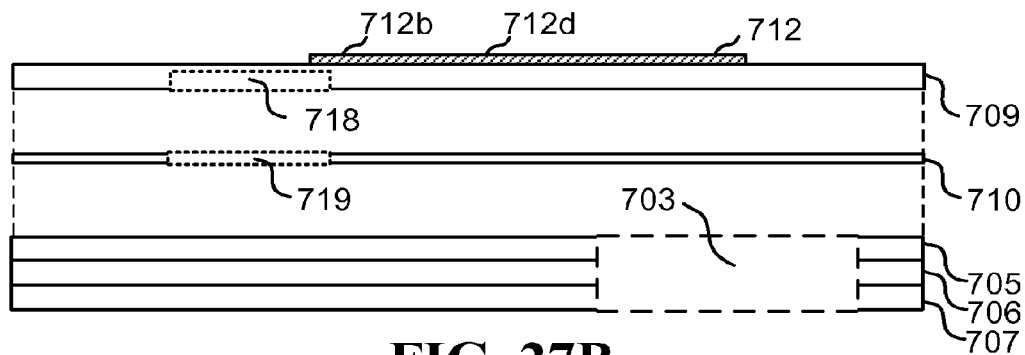
FIG. 27B illustrates a lateral cross-section of a laminate waveguide structure, and additional laminas comprising a probe and electrically conductive pads, before being pressed together into a PCB.
Figure 27C:
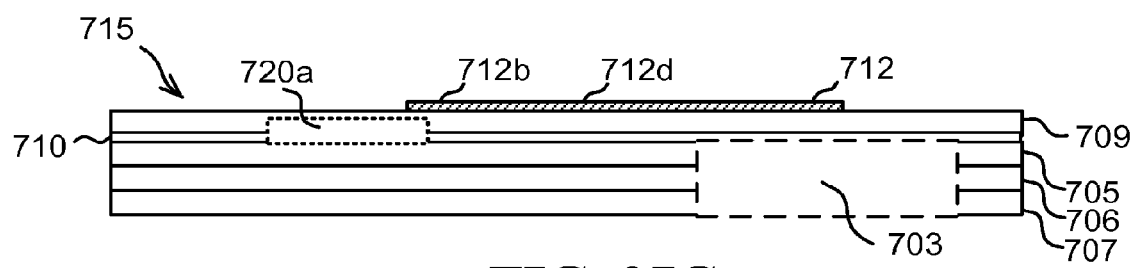
FIG. 27C illustrates a lateral cross-section of a laminate waveguide structure, and additional laminas comprising a probe and electrically conductive pads, after being pressed together into a PCB.

FIG. 27A, FIG. 27B, FIG. 27C, and FIG. 27D illustrate one embodiment of a method for constructing a millimeter-wave laminate structure using PCB processes. As shown in FIG. 27A, a first pressed laminate structure 702 comprising at least two laminas, illustrated as three laminas 705, 706 707 by way of example, and a cavity 703 is created. The cavity is plated with an electrically conductive plating 704, using a PCB plating process. The cavity 703 is operative to guide millimeter waves, in accordance with some embodiments. The first pressed laminate structure 702 (FIG. 27A) is pressed, again, together with at least two additional laminas 709, 710 (FIG. 27B, FIG. 27C) comprising a probe 712 (FIG. 27B, FIG. 27C), into a PCB 715 (FIG. 27C) comprising the first pressed laminate structure 702 and the additional laminas 709, 710, such that the cavity 703, as shown in FIG. 27C, is sealed only from one end by the additional laminas 709, 710, and the probe 712 is positioned above the cavity 703 and operative to transmit millimeter-waves through the cavity.

Figure 27D:
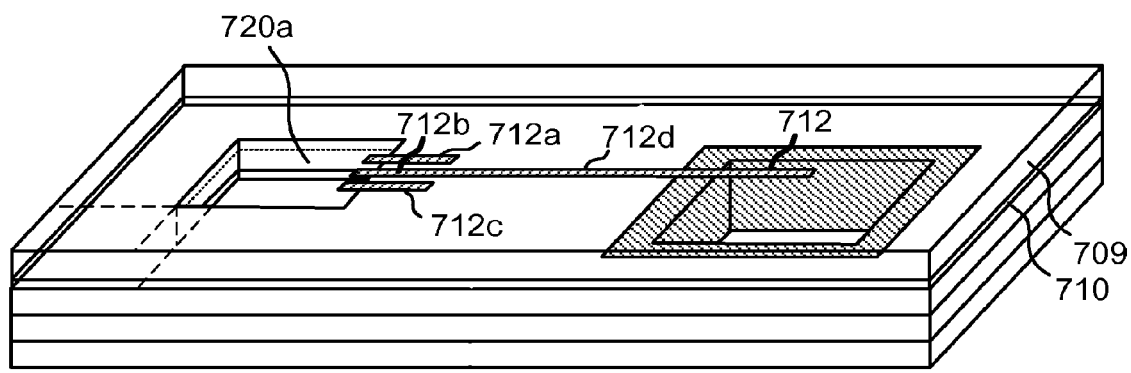
FIG. 27D illustrates one embodiment of a laminate waveguide structure, and additional laminas comprising a probe and electrically conductive pads, after being pressed together into a PCB.

In one embodiment, holes 718, 719 (FIG. 27B) are drilled in the additional laminas 709, 710, the holes 718, 719 operative to form a second cavity 720a (FIG. 27C). It is noted that the second cavity 720a is illustrated as being sealed, but cavity 720a may also be open if hole 718 is made through all of lamina 709. A bare-die Integrated Circuit is placed inside the second cavity 720a. An electrically conductive contact on the bare-die Integrated Circuit is wire-bonded with a transmission line signal trace 712d (FIG. 27B, FIG. 27C, FIG. 27D) printed on one of the additional laminas 709 that carries the probe 712, the transmission line signal trace 712d operative to connect with the probe 712 (as shown in FIG. 27B, FIG. 27C, FIG. 27D) and transport a millimeter-wave signal from the bare-die Integrated Circuit to the probe 712, and into the cavity 703 (FIGS. 27B, 27C). It is noted that "drilling holes" in the specifications and claims may refer to using a drill to form the holes, may refer to using a cutting blade to form the holes, or may refer to any other hole-forming action.

Figure 27E:
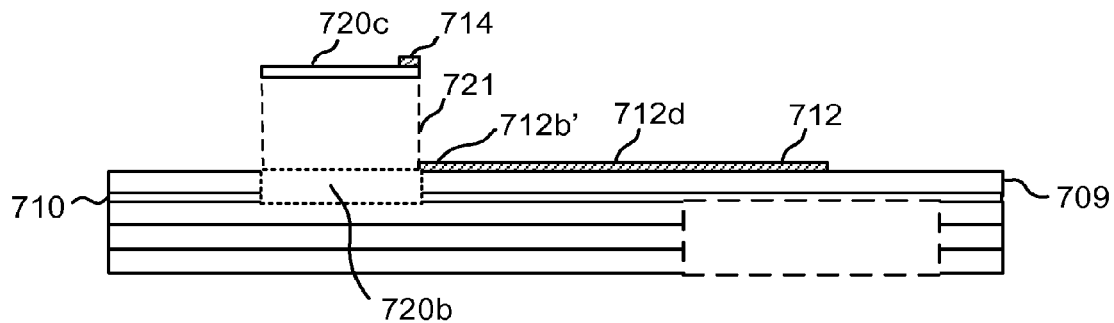
FIG. 27E illustrates a lateral cross-section of a laminate waveguide structure, additional laminas comprising a probe, electrically conductive pads, and a cavity formed by drilling a hole in the additional laminas.
Figure 27F:
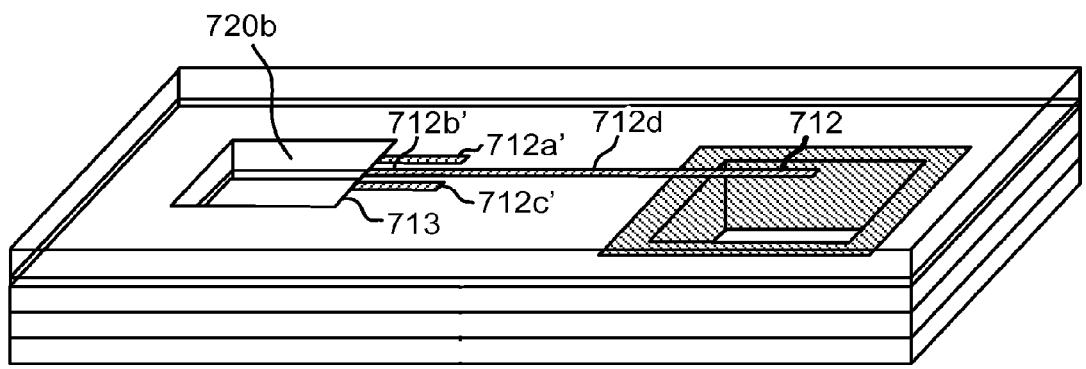
FIG. 27F illustrates one embodiment of a laminate waveguide structure, additional laminas comprising a probe, electrically conductive pads, and a cavity formed by drilling a hole in the additional laminas.
Figure 27G:
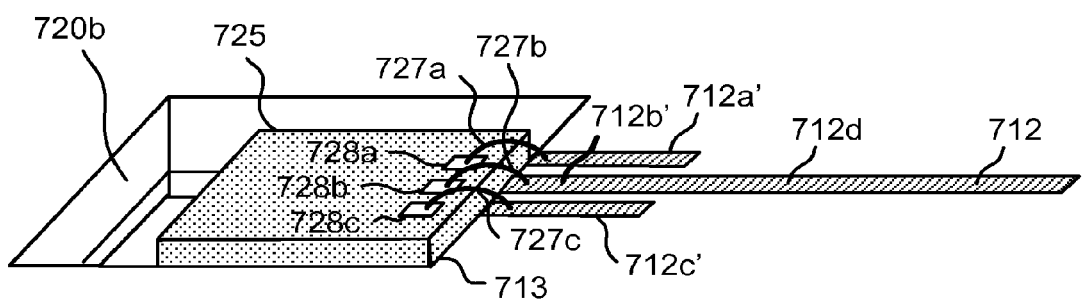
FIG. 27G illustrates one embodiment of a bare-die Integrated Circuit, three boning wires, three electrically conductive pads, and a transmission line signal trace.

FIG. 27B, FIG. 27C, FIG. 27D, FIG. 27E, FIG. 27F, and FIG. 27G illustrate one embodiment of a method for interfacing a laminate structure with a bare-die Integrated Circuit. Holes 718, 719 (FIG. 27B) are drilled in the additional laminas 709, 710 (FIGS. 27B, 27E). The holes 718, 719 form a second cavity 720b (FIG. 27E, FIG. 27F, FIG. 27G). It is noted that hole 718 (FIG. 27B) is illustrated as being partially made through lamina 709 (FIG. 27B), but it may also be made fully through lamina 709, such that cavity 720b (FIG. 27E) is formed unsealed. Referring to FIG. 27G, a bare-die Integrated Circuit 725 is placed inside the second cavity 720b. Bonding wire 727b is then used to connect an electrically conductive contact 728a on the bare-die Integrated Circuit 725 with a transmission line signal trace 712d (FIGS. 27E, 27F) printed on one of the additional laminas 709 (FIG. 27E) that carries the printed probe 712 (FIGS. 27E, 27F), in accordance with some embodiments. The transmission line signal trace 712d is operative to connect with the probe 712 and transport a millimeter-wave signal from the bare-die Integrated Circuit 725 to the probe 712, and into the cavity 703 that is shown in FIGS. 27A, 27B, 27C, in accordance with some embodiments. It is noted that numeral 712d denotes a transmission line signal trace which may be printed in continuation to a portion 712b' (FIG. 27E, FIG. 27F, FIG. 27G) of electrically conductive pad 712b (FIG. 27B, FIG. 27C, FIG. 27D). Therefore, bonding wire 727b (FIG. 27G) may be interchangeably describe as either being connected to the transmission line signal trace 712d (FIG. 27G) or to the portion 712b' (FIG. 27G) of electrically conductive pad 712b (FIG. 27B, FIG. 27C, FIG. 27D).

In one embodiment, the holes 718, 719 (FIG. 27B) in the additional laminas 709, 710 (FIG. 27B) are drilled prior to the step of pressing the first laminate structure 702 (FIG. 27A) together with the additional laminas 709, 710, and the holes 718, 719 operative to form the second cavity 720b (FIG. 27F) after the step of pressing the first laminate structure 702 together with the additional laminas 709, 710. In one embodiment, the holes in the additional laminas 709, 710 are drilled such that the second cavity 720a (FIG. 27C) is sealed inside the PCB 715 (FIG. 27C) after the step of pressing the first laminate structure together with the additional laminas 709, 710. In one embodiment, an additional hole is drilled. The additional hole is operative to open the second cavity 720a (FIG. 27C) when sealed, thereby producing the second cavity 720b (FIG. 27G) that is open. The second cavity 720b (FIG. 27G) may house the bare-die Integrated Circuit 725 (FIG. 27G) after being opened, wherein the second cavity 720a (FIG. 27C) is operative to stay clear of dirt accumulation prior to being opened.

In one embodiment, holes 718, 719 (FIG. 27B) in the additional laminas 709, 710 (FIG. 27B) are drilled such that a second cavity 720a (FIG. 27C, FIG. 27D) is sealed inside the PCB 715 (FIG. 27C) after the step of pressing the first laminate structure 702 (FIG. 27A) together with the additional laminas 709, 710. This may be achieved by drilling hole 718 partially through lamina 709. In one embodiment, an additional hole is drilled. The additional hole is operative to open the second cavity 720a into a second cavity 720b (FIG. 27E). It is noted that although both numerals 720a and 720b denote a second cavity, numeral 720a denotes the second cavity in a sealed state, and numeral 720b denotes the second cavity in an open state. The second cavity 720b (FIGS. 27E, 27F, 27G) is operative to house the bare-die Integrated Circuit 725 (FIG. 27G), while the second cavity 720a (FIGS. 27C, 27D) is operative to stay clear of dirt accumulation prior to bare-die Integrated Circuit 725 placement. Dirt accumulation may result from various manufacturing processes occurring between the step of pressing the laminate structure 702 together with laminas 709, 710, and the step of opening the second cavity 720a.

In one embodiment, lamina 709 (FIG. 27C) used to carry the probe 712 (FIG. 27C) on one side, is the same lamina used to carry a ground layer on the opposite side, and is made out of a soft laminate material suitable to be used as a millimeter-wave substrate in PCB, such as Rogers® 4350B laminate material, Arlon CLTE-XT laminate material, or Arlon AD255A laminate material. In one embodiment, the cavity 703 is dimensioned as an aperture of waveguide configured to have a cutoff frequency of 20 GHz, in accordance with some embodiments.

In one embodiment, a method for interfacing a millimeter-wave bare-die Integrated Circuit with a PCB comprises: (i) printing an electrically conductive pad on a lamina of a PCB, (ii) forming a cavity in the PCB, using a cutting tool that also cuts through the electrically conductive pads during the cavity-cutting instance, leaving a portion of the electrically conductive pad that exactly reaches the edge of the cavity, (iii) placing a bare-die Integrated Circuit inside the cavity, such that an electrically conductive contact present on an upper edge of the bare-die Integrated Circuit is brought substantially as close as possible to the portion of the electrically conductive pad, and (iv) wire-bonding the portion of the electrically conductive pad to the electrically conductive contact using a very short bonding wire required to bridge the very small distance formed between the portion of the electrically conductive pad and the electrically conductive contact.

In one embodiment, the upper edge of the bare-die Integrated Circuit substantially reaches the height of the portion of the electrically conductive pad, in accordance with some embodiments, resulting is a very short bonding wire, typically 250 microns in length. The very short bonding wire facilitates low-loss transport of millimeter-wave signals from the bare-die Integrated Circuit to the portion of the electrically conductive pad, and to transmission lines signal traces typically connected to the portion of the electrically conductive pad.

In one embodiment, a method for interfacing a bare-die Integrated Circuit with a Printed Circuit Board (PCB) includes the following steps: Printing electrically conductive pads on one lamina of a PCB. Forming a cavity of depth equal to X in the PCB, going through at least one lamina of the PCB; the act of forming the cavity also cuts through the electrically conductive pads, such that portions of the electrically conductive pads, still remaining on the PCB, reach an edge of the cavity. Placing a bare-die Integrated Circuit of thickness substantially equal to X or a heightened bare-die Integrated Circuit of thickness substantially equal to X inside the cavity, the bare-die Integrated Circuit configured to output a millimeter-wave signal from electrically conductive contacts on an upper side edge of the die; the die is placed inside the cavity such that the portions of the electrically conductive pads and the upper side edge containing the electrically conductive contacts are closely arranged side-by-side at substantially the same height. Wire-bonding each electrically conductive contact to one of the portions of the electrically conductive pads using a bonding wire to bridge a small distance formed between the electrically conductive contacts and the portions of the electrically conductive pads when placing the bare-die Integrated Circuit inside the cavity.

In one embodiment, the electrically conductive pads comprise three electrically conductive pads 712a, 712b, 712c (FIG. 27D), printed on one of the laminas 709 of the PCB, the portions 712a', 712b', 712c' (FIG. 27F, FIG. 27G) of the three electrically conductive pads 712a, 712b, 712c operative to substantially reach the edge 713 (FIG. 27G) of the cavity. The bare-die Integrated Circuit 725 is configured to output a millimeter-wave signal from three electrically conductive contacts 728a, 728b, 728c (FIG. 27G) arranged in a ground-signal-ground configuration on the upper side edge of the die. Three bonding wires 727a, 727b, 727c (FIG. 27G) or strips are used to wire-bond each electrically conductive contact 728a, 728b, 728c to one of the portions 712a', 712b', 712c' of the electrically conductive pads 712a, 712b, 712c.

FIG. 27D, FIG. 27E, FIG. 27F, FIG. 27G, and FIG. 27H illustrate one embodiment of a method for interfacing a bare-die Integrated Circuit with a PCB, in accordance with some embodiments. Electrically conductive pads 712a, 712b, 712c (FIG. 27D) are printed on lamina 709 of a PCB 715 (FIG. 27C). A cavity 720b (FIG. 27E) of depth equal to X is formed in the PCB 715. At least one of the cuts used to form the cavity, also cuts through the electrically conductive pads 712a, 712b, 712c the at least one cut is denoted by numeral 721 (FIG. 27E), such that portions 712a', 712b', 712c' (FIG. 27F) of the electrically conductive pads 712a, 712b, 712c, still remaining on the PCB, reach an edge 713 (FIG. 27F) of the cavity 720b, and the other portions 714 (FIG. 27E) and lamina excess 720c (FIG. 27E) are removed from the PCB. A bare-die Integrated Circuit 725 (FIG. 27G) of thickness substantially equal to X is placed inside the cavity 720b, such that the remaining portions 712a', 712b', 712c' (FIG. 27G) of pads 712a, 712b, 712c and an upper side edge containing electrically conductive contacts 728a, 728b, 728c (FIG. 27G) of the bare-die Integrated Circuit 725 are closely arranged side-by-side at substantially the same height, in accordance with some embodiments. The electrically conductive contacts are then wire-bonded to the remaining portions 712a', 712b', 712c' of the electrically conductive pads 712a, 712b, 712c using short bonding wires 727a, 727b, 727c (FIG. 27G).

In one embodiment, as shown in FIG. 27G, a probe 712 is printed on the same lamina 709 (FIG. 27E) as the portion 712b' of electrically conductive pad 712b (FIG. 27C) connected to the electrically conductive contact 728b associated with the signal. A transmission line signal trace 712d is printed as a continuation to the portion 712b' of electrically conductive pad 712 connected to electrically conductive contact 728b associated with the signal, the transmission line signal trace 712d electrically connecting electrically conductive contact 728b associated with the signal to the probe 712.

Figure 27H:
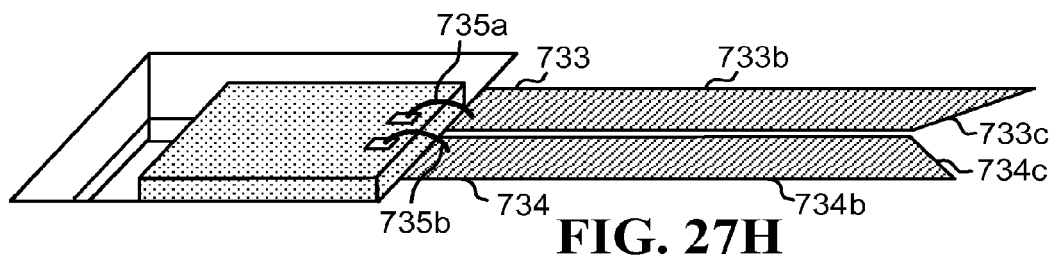
FIG. 27H illustrates one embodiment of a laminate structure, a bare-die Integrated Circuit, two boning wires, two electrically conductive pads, extending into a slot-line transmission line, and a printed probe.

FIG. 27H illustrates one embodiment, in which the electrically conductive pads comprise two electrically conductive pads, printed on one of the laminas of the PCB, the portions 733, 734 of the two electrically conductive pads operative to substantially reach the edge of the cavity. A bare-die Integrated Circuit is configured to output a millimeter-wave signal from two electrically conductive contacts arranged in a differential signal configuration on the upper side edge of the die in accordance with some embodiments. Two bonding wires 735a, 735b or strips are used to wire-bond each electrically conductive contact to one of the portions 733, 734 of the electrically conductive pads, in accordance with some embodiments.

In one embodiment, a probe 733c, 734c is printed on the same lamina as the portions 733, 734 of electrically conductive pads connected to electrically conductive contacts in accordance with some embodiments. A slot-line transmission line 733b, 734b is printed as a continuation to portions 733, 734 of the electrically conductive pads, the slot-line transmission line 733b, 734b electrically connecting the electrically conductive contacts to the probe 733c, 734c.

In one embodiment, a laminate waveguide structure is embedded in the laminas of the PCB 715 (FIG. 27C) and the probe 712 (FIG. 27C) is located above the laminate waveguide structure, in accordance with some embodiments. In one embodiment, the laminate waveguide structure includes cavity 703 (FIG. 27C) in accordance with some embodiments.

Figure 28A:
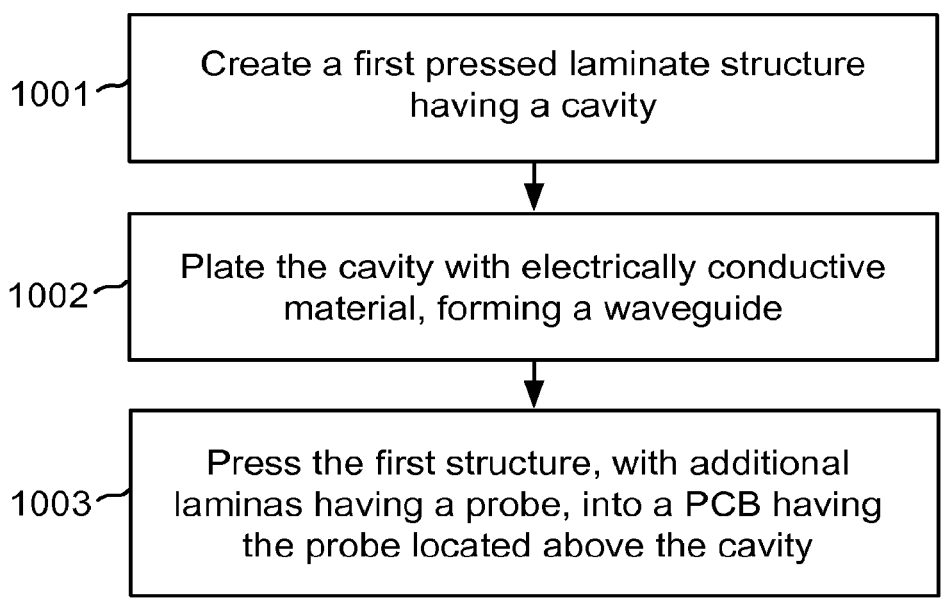
FIG. 28A illustrates a flow diagram describing one method for constructing a PCB comprising a laminate waveguide structure and a probe.

FIG. 28A is a flow diagram illustrating one method of constructing laminate waveguide structures within a PCB, comprising the following steps: In step 1001, creating a first pressed laminate structure comprising a cavity. In step 1002, plating the cavity with electrically conductive material. In step 1003, pressing the first laminate structure, with additional laminas comprising a probe, into a PCB comprising the probe located above the cavity.

Figure 28B:
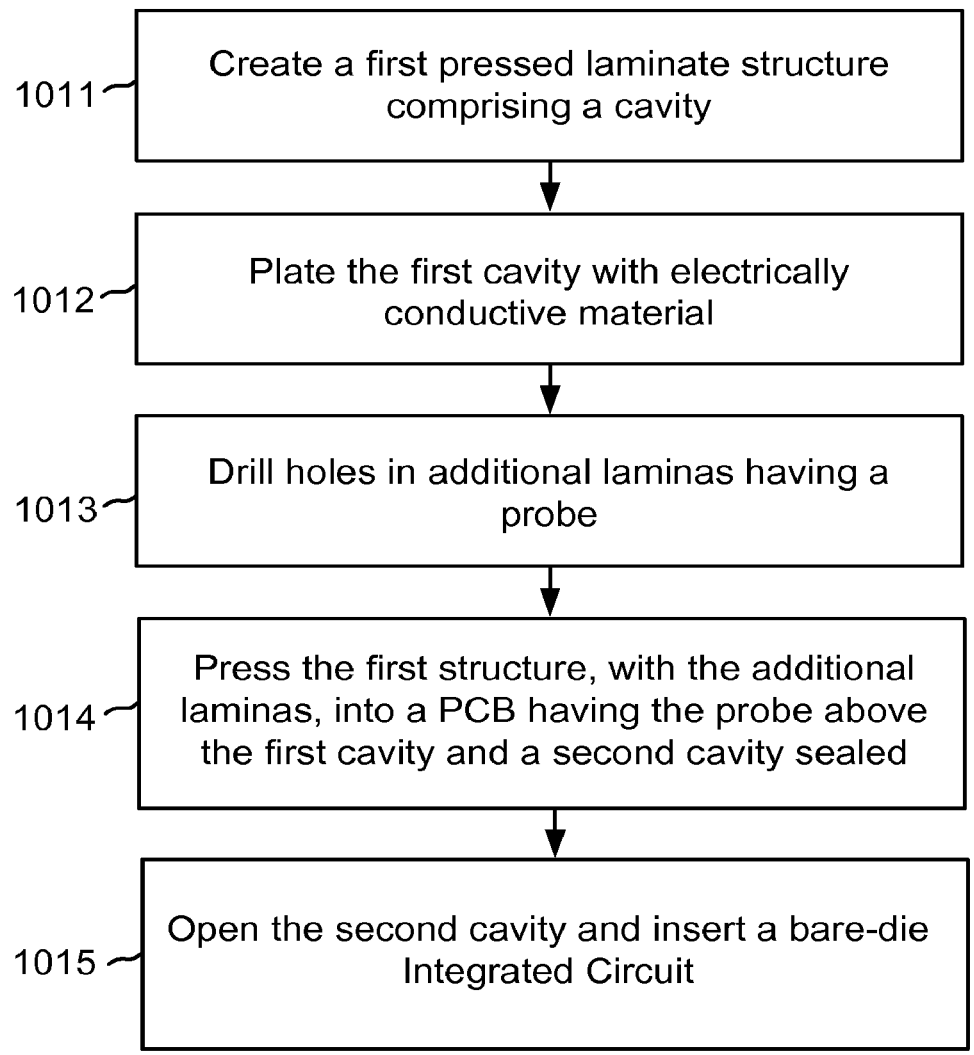
FIG. 28B illustrates a flow diagram describing one method for constructing a PCB comprising a laminate waveguide structure, a probe, and a bare-die Integrated Circuit.

FIG. 28B is a flow diagram illustrating one method of constructing a system comprising a bare-die Integrated Circuit and a PCB, comprising the following steps: In step 1011, creating a first pressed laminate structure comprising a cavity. In step 1012, plating the cavity with electrically conductive material. In step 1013, drilling holes in additional laminas comprising a probe. In step 1014, pressing the first pressed laminate structure, with the additional laminas, into a PCB comprising the probe located above the cavity and a second cavity formed by the holes and sealed in the PCB. In step 1015, opening the sealed second cavity and inserting a bare-die Integrated Circuit into the cavity.

Figure 28C:
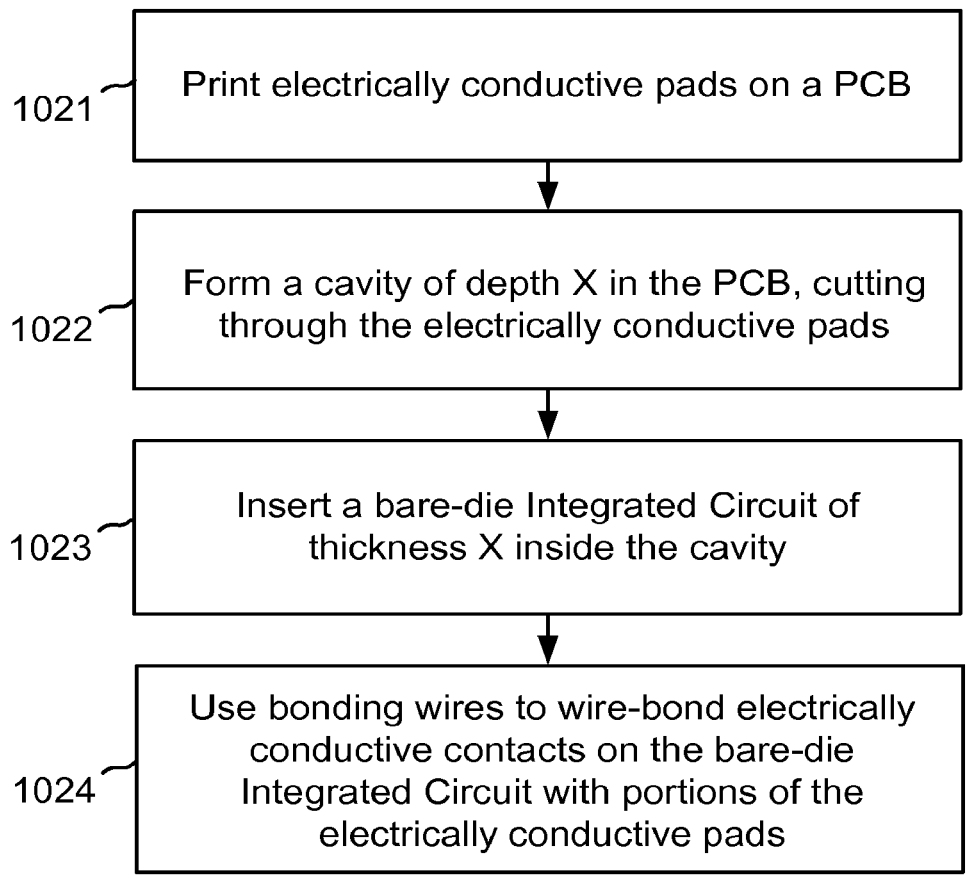
FIG. 28C illustrates a flow diagram describing one method for interfacing between a bare-die Integrated Circuit and a PCB.

FIG. 28C is a flow diagram illustrating one method of interfacing between a bare-die Integrated Circuit and a PCB, comprising the following steps: In step 1021, printing electrically conductive pads on a PCB. In step 1022, forming a cavity of depth equal to X in the PCB, the act of forming the cavity also cuts through the electrically conductive pads, leaving portions the electrically conductive pads that reach an edge of the cavity. In step 1023, placing a bare-die Integrated Circuit of thickness substantially equal to X inside the cavity, such that electrically conductive contacts on an upper side edge of the bare-die Integrated Circuit are placed side-by-side with the portions of the electrically conductive pads. In step 1024, using bonding wires or strips to wire-bond the electrically conductive contacts with the portions of the electrically conductive pads.

In one embodiment, the physical dimensions of millimeter-wave structures or components described in some embodiments, such as laminate waveguides, discrete waveguides, transmission line printed traces, transmission line substrates, backshort surfaces, and bare-die Integrated Circuits, are optimized for operation in the 57 GHz-86 GHz band.

In this description, numerous specific details are set forth. However, the embodiments/cases of the invention may be practiced without some of these specific details. In other instances, well-known hardware, materials, structures and techniques have not been shown in detail in order not to obscure the understanding of this description. In this description, references to "one embodiment" and "one case" mean that the feature being referred to may be included in at least one embodiment/case of the invention. Moreover, separate references to "one embodiment", "some embodiments", "one case", or "some cases" in this description do not necessarily refer to the same embodiment/case. Illustrated embodiments/cases are not mutually exclusive, unless so stated and except as will be readily apparent to those of ordinary skill in the art. Thus, the invention may include any variety of combinations and/or integrations of the features of the embodiments/cases described herein. Also herein, flow diagrams illustrate non-limiting embodiment/case examples of the methods, and block diagrams illustrate non-limiting embodiment/case examples of the devices. Some operations in the flow diagrams may be described with reference to the embodiments/cases illustrated by the block diagrams. However, the methods of the flow diagrams could be performed by embodiments/cases of the invention other than those discussed with reference to the block diagrams, and embodiments/cases discussed with reference to the block diagrams could perform operations different from those discussed with reference to the flow diagrams. Moreover, although the flow diagrams may depict serial operations, certain embodiments/cases could perform certain operations in parallel and/or in different orders from those depicted. Moreover, the use of repeated reference numerals and/or letters in the text and/or drawings is for the purpose of simplicity and clarity and does not in itself dictate a relationship between the various embodiments/cases and/or configurations discussed. Furthermore, methods and mechanisms of the embodiments/cases will sometimes be described in singular form for clarity. However, some embodiments/cases may include multiple iterations of a method or multiple instantiations of a mechanism unless noted otherwise. For example, when a controller or an interface are disclosed in an embodiment/case, the scope of the embodiment/case is intended to also cover the use of multiple controllers or interfaces.

Certain features of the embodiments/cases, which may have been, for clarity, described in the context of separate embodiments/cases, may also be provided in various combinations in a single embodiment/case. Conversely, various features of the embodiments/cases, which may have been, for brevity, described in the context of a single embodiment/case, may also be provided separately or in any suitable sub-combination. The embodiments/cases are not limited in their applications to the details of the order or sequence of steps of operation of methods, or to details of implementation of devices, set in the description, drawings, or examples. In addition, individual blocks illustrated in the figures may be functional in nature and do not necessarily correspond to discrete hardware elements. While the methods disclosed herein have been described and shown with reference to particular steps performed in a particular order, it is understood that these steps may be combined, sub-divided, or reordered to form an equivalent method without departing from the teachings of the embodiments/cases. Accordingly, unless specifically indicated herein, the order and grouping of the steps is not a limitation of the embodiments/cases. Embodiments/cases described in conjunction with specific examples are presented by way of example, and not limitation. Moreover, it is evident that many alternatives, modifications and variations will be apparent to those skilled in the art. Accordingly, it is intended to embrace all such alternatives, modifications and variations that fall within the spirit and scope of the appended claims and their equivalents.

What is claimed is:

1. A system configured to inject and guide millimeter-waves through a Printed Circuit Board (PCB), comprising:
at least two laminas;
an electrically conductive plating, applied on insulating walls of a cavity formed perpendicularly through the at least two laminas; and
a probe located above the cavity, and printed on a lamina that is directly joined to the at least two other laminas and the cavity via a prepreg bonding lamina;
wherein the cavity is configured to guide millimeter-waves injected by the probe at one side of the cavity to the other side of the cavity, and the lamina on which the probe is printed, the prepreg bonding lamina, and the at least two other laminas, are all pressed together forming a PCB constituting a single structure, such that said injection and guidance of millimeter-waves are all done completely inside the PCB.

2. The system of claim 1, further comprising:
electrically conductive surfaces printed on the at least two laminas, the electrically conductive surfaces extending outwards from the cavity, and are electrically connected to the electrically conductive plating; and
at least 10 Vertical Interconnect Access (VIA) holes going through the at least two laminas and the electrically conductive surfaces, the at least 10 VIA holes are plated or filled with electrically conductive material connected to the electrically conductive surfaces, and the at least 10 VIA holes located around the cavity, thereby forming an electrically conductive cage.

3. The system of claim 2, further comprising a ground layer or at least one ground trace associated with a transmission line signal trace, forming a transmission line for the millimeter-waves, the transmission line reaching the probe; the at least one ground trace electrically connected to at least one of the electrically conductive surfaces, and the transmission line configured to carry the millimeter-waves from a source connected to one end of the transmission line to the probe.

4. The system of claim 3, further comprising at least one of the at least 10 VIA holes electrically connecting the electrically conductive plating to the ground layer or the at least one ground trace.

5. The system of claim 1, wherein the at least two laminas are PCB laminas, laminated together by another prepreg bonding lamina.

6. The system of claim 1, wherein the at least two laminas are PCB laminas, out of which at least one is another prepreg bonding lamina.

7. The system of claim 1, further comprising:
electrically conductive surfaces printed on the at least two laminas, the surfaces extending outwards from the cavity and electrically connected to the electrically conductive plating; and
a ground layer or at least one ground trace associated with a transmission line signal trace, forming a transmission line for the millimeter-waves, the transmission line is printed on the lamina on which the probe is printed and reaching the probe; the ground trace is electrically connected to at least one of the electrically conductive surfaces by at least one VIA, such that a millimeter-wave path is created in which the transmission line feeds directly the probe, and the probe injects directly the millimeter-waves into the cavity.

8. The system of claim 1, further comprising a receiver probe located below the cavity, and printed on an additional lamina; the receiver probe configured to receive the millimeter-waves injected to the cavity by the probe located above the cavity.

9. The system of claim 1, further comprising a discrete waveguide located below the cavity and as a continuation to the cavity; the discrete waveguide configured to pass-through the millimeter-waves guided by the cavity into the discrete waveguide.

10. The system of claim 1, wherein the cavity is dimensioned to form a waveguide having a cutoff frequency above 20 GHz.

11. The system of claim 1, wherein the lamina used to carry the probe on one side thereof also carries a micro strip trace operative to feed the probe, the lamina used to carry the probe on one side thereof is the lamina used to carry a ground trace associated with the micro strip trace on the opposite side thereof, and the lamina carrying the probe, micro strip trace, and ground trace, is made out of a soft laminate material suitable to be used as a millimeter-wave band substrate in the PCB, such that a millimeter-wave path is created in which the microstrip feeds directly the probe, and the probe injects directly the millimeter-waves into the cavity.

12. A system operative to inject and guide millimeter-waves through a Printed Circuit Board (PCB) laminate structure, comprising:
at least two laminas belonging to the laminate structure;
a plurality of Vertical Interconnect Access (VIA) holes passing through the at least two laminas, the plurality of VIA holes are placed side by side forming a contour of a waveguide aperture, and the at least two laminas are at least partially transparent to at least a range of millimeter-wave frequencies;
the plurality of VIA holes plated or filled with an electrically conductive material, forming an electrically conductive cage enclosing the contour of the waveguide aperture; and
a probe located above the electrically conductive cage, and printed on an additional lamina belonging to the laminate structure;
wherein the electrically conductive cage is operative to guide the millimeter-waves, transmitted by the probe, through the at least two laminas, the lamina on which the probe is printed is bonded to the at least two laminas using a prepreg bonding lamina, and the laminate structure is pressed together, thereby forming the PCB laminate structure constituting a single structure, such that said injection and guidance of the millimeter-waves are all done completely inside the PCB laminate structure.

13. The system of claim 12, further comprising a cavity confined by the electrically conductive cage, the cavity going through the at least two laminas, and the millimeter-waves are guided through the cavity.

14. The system of claim 12, further comprising electrically conductive surfaces printed on the at least two laminas, such that the plurality of VIA holes pass through the electrically conductive surfaces, and the electrically conductive surfaces enclose the contour.

15. A system configured to inject and guide millimeter-waves through a Printed Circuit Board (PCB) laminate structure, comprising:
at least one lamina, the at least one lamina comprising a cavity shaped in the form of a waveguide aperture;
an electrically conductive plating, applied on insulating walls of the cavity; and
a probe located above the cavity, and printed on a lamina different than the at least one lamina;
wherein the cavity is configured to guide the millimeter-waves injected by the probe at one side of the cavity to the other side of the cavity, the lamina on which the probe is printed is bonded to the at least one lamina using a prepreg bonding lamina, and the lamina on which the probe is printed, the prepreg bonding lamina, and the at least one lamina comprising the cavity, are all pressed together, thereby forming the PCB laminate structure constituting a single structure, such that said injection and guidance of the millimeter-waves are all done completely inside the PCB laminate structure.

16. A system operative to guide millimeter-waves through a Printed Circuit Board (PCB) laminate structure, comprising:
a plurality of Vertical Interconnect Access (VIA) holes passing through at least one lamina of the PCB laminate structure, the plurality of VIA holes placed side by side forming a contour of a waveguide aperture, and the at least one lamina is at least partially transparent to at least a range of millimeter-wave frequencies;
the plurality of VIA holes plated or filled with an electrically conductive material, thereby forming an electrically conductive cage enclosing the contour of the waveguide aperture; and
a probe located above the electrically conductive cage, and printed on a lamina of the at least one lamina belonging to the PCB laminate structure;
wherein the electrically conductive cage is operative to guide the millimeter-waves, transmitted by the probe, through the at least one lamina, the lamina on which the probe is printed is bonded to the at least one lamina using a prepreg bonding lamina, and the lamina on which the probe is printed, the prepreg bonding lamina, and the at least one lamina comprising the VIA holes, are all pressed together, thereby forming a PCB laminate structure constituting a single structure, such that said transmission and guidance of the millimeter-waves are all done completely inside the PCB laminate structure.

17. A system configured to inject and guide millimeter-waves through a Printed Circuit Board (PCB) laminate structure, comprising:
at least two laminas belonging to the PCB, the at least two laminas are contiguous and electrically insulating;
an electrically conductive plating, applied on insulating walls of a cavity formed perpendicularly through the at least two laminas, the electrically conductive plating and the cavity form a waveguide; and
an antenna embedded inside an Integrated Circuit, the antenna located above the cavity, and the Integrated Circuit soldered to electrically conductive pads printed on an additional lamina belonging to the PCB and located above the at least two laminas through which the cavity is formed;
the cavity configured to guide the millimeter-waves injected by the antenna at one side of the cavity to the other side of the cavity.

18. The system of claim 17, wherein the Integrated Circuit is a flip-chip or Solder-Bumped die, the antenna is an integrated patch antenna, and the integrated patch antenna is configured to radiate the millimeter waves towards the cavity.

19. The system of claim 18, further comprising:
electrically conductive surfaces printed on the at least two laminas, the surfaces extending outwards from the cavity, and are electrically connected to the electrically conductive plating; and
Vertical Interconnect Access (VIA) holes going through the at least two laminas and the electrically conductive surfaces, the VIA holes plated or filled with electrically conductive material electrically connected to the electrically conductive surfaces, and the VIA holes located around the cavity, thereby forming an electrically conductive cage extending the waveguide above the cavity towards the Integrated Circuit.

\* \* \* \* \*